United States Patent [19]
Suma et al.

[11] Patent Number: 5,400,290
[45] Date of Patent: Mar. 21, 1995

[54] SEMICONDUCTOR DEVICE ALLOWING ACCURATE CHARACTERISTICS TEST

[75] Inventors: Katsuhiro Suma; Masaki Tsukude; Yukinobu Adachi, all of Hyogo, Japan

[73] Assignee: Mitsubishi Denki Kabushiki Kaisha, Tokyo, Japan

[21] Appl. No.: 141,002

[22] Filed: Oct. 26, 1993

[30] Foreign Application Priority Data

Oct. 29, 1992 [JP] Japan ................................ 4-291135
Jul. 16, 1993 [JP] Japan ................................ 5-176414

[51] Int. Cl.$^6$ ................................................ G11C 8/00
[52] U.S. Cl. ...................................... 365/226; 365/233; 365/193; 365/201
[58] Field of Search ............... 365/226, 227, 233, 191, 365/193, 201

[56] References Cited

U.S. PATENT DOCUMENTS 5,046,052  9/1991  Miyaji et al. ................... 365/226

FOREIGN PATENT DOCUMENTS 63-266696  11/1988  Japan .
2-162756   6/1990   Japan .
4-22000    1/1992   Japan .

OTHER PUBLICATIONS

"16M DRAM" Nikkei Micro Devices, Oct. 1991 pp. 48–52.
"Application of a High–Voltage Pumped Supply for Low–Power DRAM", R. C. Foss et al., 1992, Symposium on FLSI Circuits Digest of Technical Papers pp. 106–107.
"A 34–ns 16–Mb DRAM with Controllable Voltage Down–Converter", Hidaka et al., IEEE Journal of Solid–State Circuits, vol. 23, No. 5, Oct. 1988 pp. 1020–1026.
"Dual–Operating–Voltage Scheme for a Single 5–V 16–Mbit DRAM", Horiguchi et al., IEEE Journal of Solid–State Circuits, vol. 23, No. 5, Oct. 1988 pp. 1128–1132.

*Primary Examiner*—Joseph A. Popek
*Attorney, Agent, or Firm*—Lowe, Price, LeBlanc & Becker

[57] ABSTRACT

In response to an external control signal, a first timing detecting circuit and a high voltage detecting circuit detect setting of a signature mode and provide a signature mode signal to a second timing detecting circuit. The second timing detecting circuit outputs an output buffer activating signal to the output buffer in response to the external control signal. In response to the output buffer activating signal, the output buffer detects an internal supply voltage and provides the same to an external pin.

20 Claims, 31 Drawing Sheets

SEMICONDUCTOR DEVICE ALLOWING ACCURATE CHARACTERISTICS TEST

BACKGROUND OF THE INVENTION

1. Field of the Invention

The present invention relates to semiconductor devices and, more specifically, to a semiconductor device which is subjected to a prescribed characteristics test.

2. Description of the Background Art

Recently, since the breakdown voltage of devices have been decreased as the devices are miniaturized, external supply voltage applied from the outside of the device is at first lowered to an internal supply voltage which is lower than the aforementioned external supply voltage by an internal voltage lowering circuit provided in the chip, and then is supplied to an internal circuit. An MOS DRAM (Dynamic Random Access Memory) mounting the above mentioned internal voltage lowering circuit is disclosed in IEEE JSSC, Vol. 23, No. 5, pp. 1128-1132, October 1988.

The conventional internal voltage lowering circuit mentioned above will be described with reference to the figures. FIG. 18 shows a structure of the conventional internal voltage lowering circuit.

Referring to FIG. 18, the internal voltage lowering circuit includes a voltage generating circuit 10a receiving an external supply voltage $V_{CC}$ and outputting a reference voltage V1; a voltage generating circuit 10b receiving the external supply voltage $V_{CC}$ and outputting a reference voltage V2; a reference voltage generating circuit 10c receiving reference voltages V1 and V2 for generating a reference voltage VL obtained by combining the two reference voltages V1 and V2; a current mirror circuit 20 receiving the reference voltage VL and an internal supply voltage $IV_{CC}$ from a node N4, including transistors Q27 to Q30 and a constant current source J1; a driver circuit 30 including a transistor Q35 receiving an output from current mirror circuit 20 and outputting the internal supply voltage $IV_{CC}$ at a node N4; and a constant current source J2.

Reference voltage generating circuit 10c will be described with reference to the figures. FIG. 19 shows detailed structure of reference voltage generating circuit 10c.

Referring to FIG. 19, reference voltage generating circuit 10c includes a current mirror amplifier 11 receiving the reference voltage V1 output from voltage generating circuit 10a, and including p channel MOS transistors Q61 and Q62, n channel MOS transistors Q63 and Q64 and a constant current source J3; a current mirror amplifier 12 receiving the reference voltage V2 output from Voltage generating circuit 10b and including p channel MOS transistors Q65 and Q66, n channel MOS transistors Q67 and Q68, and a constant current source J4; and an output stage 13 receiving outputs from current mirror amplifiers 11 and 12, outputting the reference voltage VL, and including p channel MOS transistors Q69 and Q70 as well as resistors R3 and R4.

FIG. 20 is a graph showing relation of the reference voltages V1, V2, V1 and the external supply voltage $V_{CC}$ of reference voltage generating circuit 10c structured as described above. As can be seen from FIG. 20, reference voltage generating circuit 10c generates a reference voltage VL which is a combination of reference voltages V1 and V2.

The operation of the internal voltage lowering circuit having the above structure will be described. When the internal supply voltage $IV_{CC}$ output from node N4 comes to be higher than the reference voltage VL output from reference voltage generating circuit 10c, the amount of current flowing through transistor Q29 will be larger than the amount of current flowing through transistor Q30. At this time, potential at a node N5 rises, so that transistor Q35 is rendered shallowly conductive or non-conductive. As a result, current supply from external supply voltage $V_{CC}$ to node N4 is decreased or stopped, so that internal supply voltage $IV_{CC}$ lowers to the reference voltage VL.

By contrast, when the internal supply voltage $IV_{CC}$ becomes lower than the reference voltage VL, the amount of current flowing through transistor Q29 will be smaller than the amount of current flowing through transistor Q30. At this time, the potential at node N5 lowers, so that transistor Q35 is rendered conductive. As a result, sufficient current is supplied from external supply voltage $V_{CC}$ to node N4, so that the internal supply voltage $IV_{CC}$ rises to the reference voltage VL.

FIG. 21 shows dependency of the reference voltage VL and the internal supply voltage $IV_{CC}$ on the external supply voltage $V_{CC}$. As shown in FIG. 21, the internal supply voltage $IV_{CC}$ increases linearly until the external supply voltage $V_{CC}$ reaches 4 V. While the external supply voltage $V_{CC}$ is within the range from 4 to 7 V, the internal supply voltage $IV_{CC}$ is constant at 4 V. When the external supply voltage $V_{CC}$ exceeds 7V, the internal supply voltage $IV_{CC}$ increases linearly.

In the semiconductor device including such an internal voltage lowering circuit as described above, when a transistor parameter, sheet resistance of resistance material or the like changes, the characteristic of the internal supply voltage $IV_{CC}$ with respect to the external supply voltage $V_{CC}$ shown in FIG. 21 inevitably changes. Accordingly, when burn-in test (acceleration test under voltage) of semiconductor devices having various characteristics is to be carried out, the accelerating voltage varies from device to device, even if a constant external supply voltage $V_{CC}$ is supplied, as the internal supply voltage $IV_{CC}$ is different. In the conventional standard semiconductor device such as a DRAM, the internal supply voltage $IV_{CC}$ is not provided at the external pin, and therefore it has been impossible to monitor the internal supply voltage $IV_{CC}$ to adjust the accelerating voltage. Consequently, those semiconductor devices to which high accelerating voltage is applied come to have their characteristics degraded, while those devices to which low accelerating voltage is applied cannot be well screened.

In addition, when defect analysis is to be carried out on the defective devices found through the burn-in test or other tests, it is impossible to monitor the voltages of internal supply lines and signal lines when the defective devices are in the molded shape, which prevents adequate defect analysis.

SUMMARY OF THE INVENTION

An object of the present invention is to provide a semiconductor device on which characteristics test can be effected accurately.

Another object of the present invention is to provide a semiconductor device in which voltages of internal supply lines and signal lines can be monitored.

A still further object of the present invention is to provide a semiconductor device in which input of a voltage which is higher than the normally input voltage can be accurately detected.

According to an aspect of the present invention, the semiconductor device includes a first designation signal output circuit responsive to a first external control signal for outputting a first designation signal designating a prescribed mode; a second designation signal output circuit responsive to a second external control signal and the first designation signal for outputting a second designation signal designating output of a potential of a prescribed internal node; and an output circuit responsive to the second designation signal for outputting the potential of the prescribed internal node to an external terminal.

The first designation signal output means designates a prescribed mode to the second designation signal output means in response to the first external control signal. The second designation signal output means designates output of a potential of a prescribed internal node to the output means in response to the second external control signal and the first designation signal, and determines the output timing. As a result, the output means can provide the potential at the prescribed internal node to the external terminal at a prescribed timing which is determined by the first and second external control signals.

Consequently, the potential of the prescribed internal node can be output to the external terminal, enabling accurate characteristics test of the semiconductor device.

In accordance with another aspect of the present invention, the semiconductor device includes a voltage lowering circuit for converting an external input signal of a first voltage to a signal of a third voltage by lowering the voltage by a second voltage; a detecting circuit for outputting a prescribed detection signal of the first voltage when the voltage of the signal having the third voltage is higher than a fourth voltage; and an adjusting circuit for adjusting the second or fourth voltage.

Even when the second voltage fluctuates and the third voltage changes, the second or the fourth voltage can be adjusted by the adjusting circuit, and therefore the first voltage can be detected accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device in accordance with the first embodiment of the present invention will be described with reference to the figures.

Figure 28:
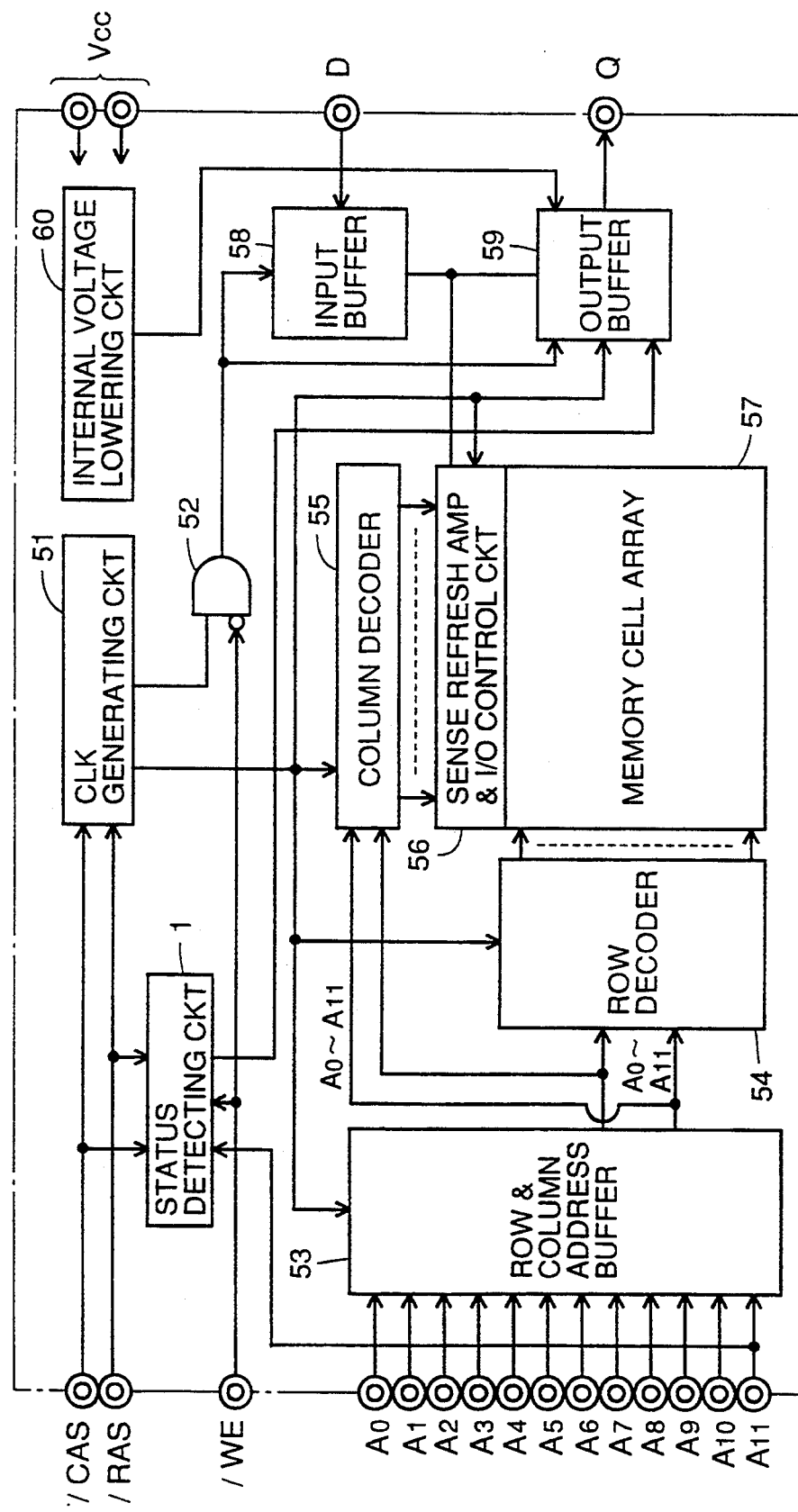
FIG. 28 is a block diagram showing a structure of the semiconductor device in accordance with the first embodiment of the present invention.

FIG. 28 shows a structure of the semiconductor device in accordance with the first embodiment of the present invention. In FIG. 28, a CMOS processed DRAM having 1-bit structure is shown as an example of the semiconductor device. The present invention is not limited to the aforementioned DRAM but it can be applied to any semiconductor devices which are subjected to a prescribed characteristics test.

Referring to FIG. 28, the semiconductor device includes a status detecting circuit 1, a clock generating circuit 51, a gate 52, a row and column address buffer 53, a row decoder 54, a column decoder 55, a sense refresh amplifier and input/output control circuit 56, a memory cell array 57, an input buffer 58, an output buffer 59 and an internal voltage lowering circuit 60. The semiconductor device carries out a prescribed operation in response to a column address strobe signal /CAS ("/" indicates an inverted signal), a row address strobe signal /RAS and a write enable signal /WE to store data in a prescribed memory cell of memory cell array 57 corresponding to the row and column addresses designated by address signals A0 to A11 or to read stored data. The data to be stored is transmitted through input buffer 58 to memory cell array 57, while read data is output through output buffer 59. The above described operation is similar to that in a common DRAM.

Figure 18:
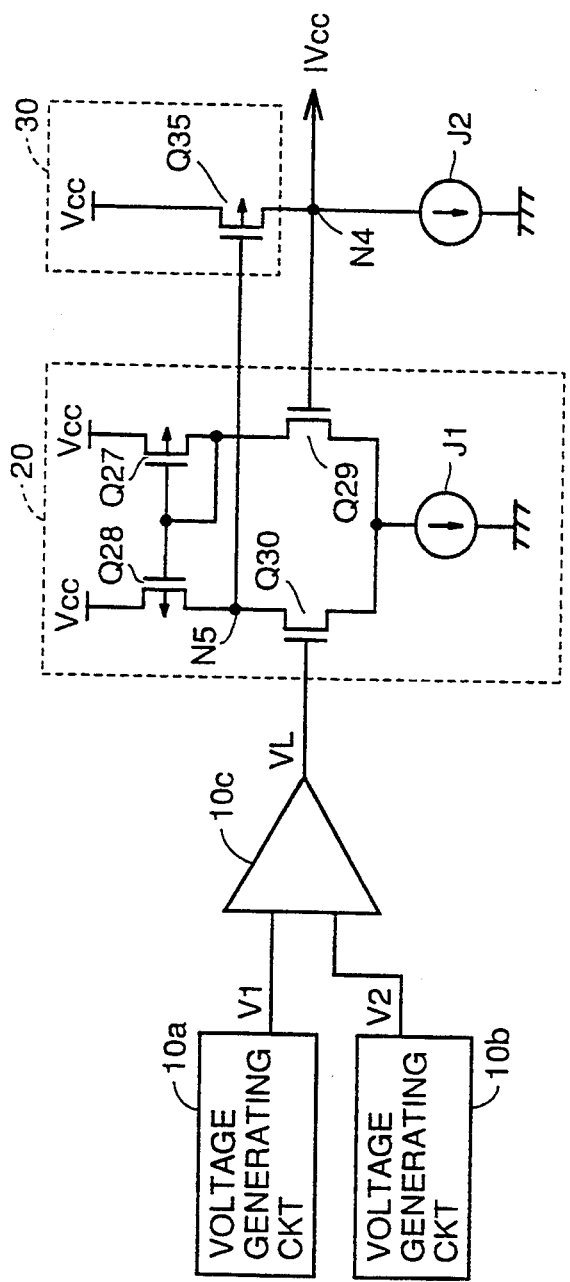
FIG. 18 shows a structure of a conventional internal voltage lowering circuit.
Figure 19:
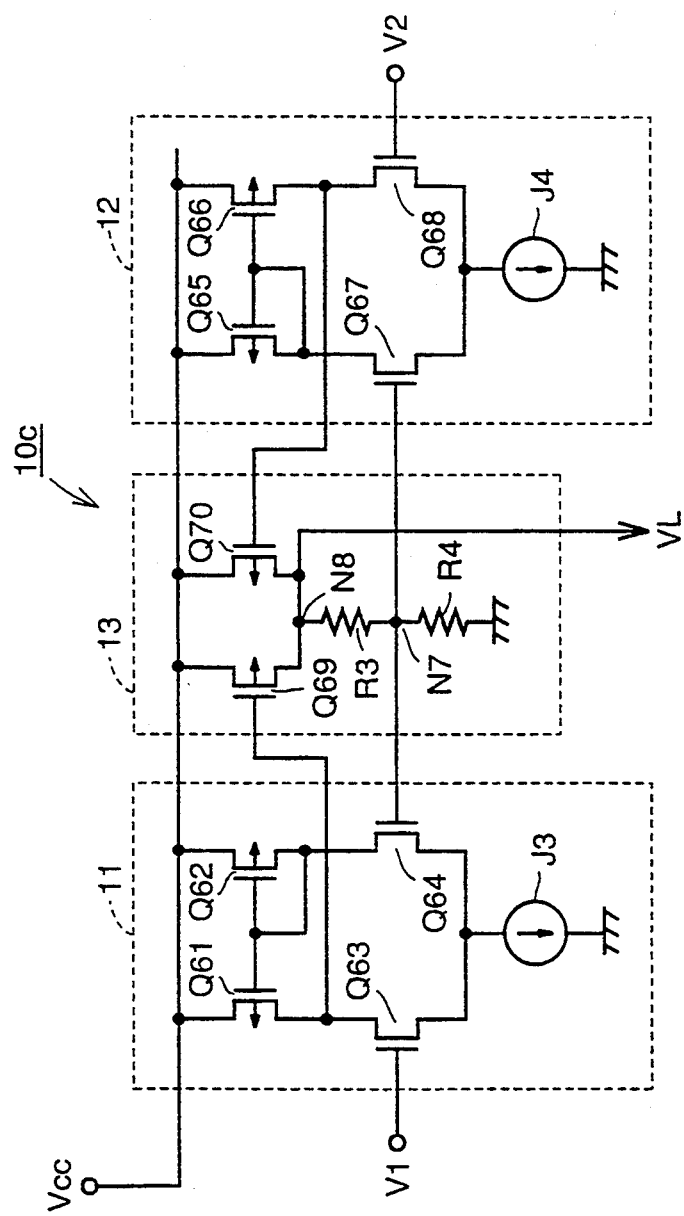
FIG. 19 is a schematic diagram showing a structure of a reference voltage generating circuit shown in FIG. 18.
Figure 20:
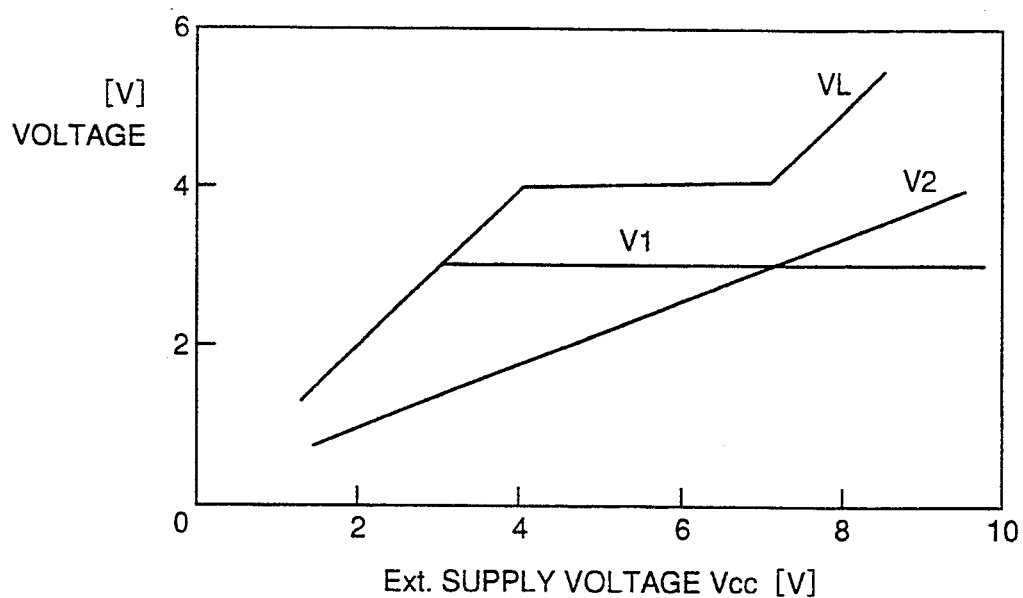
FIG. 20 shows dependency of the reference voltage on the external supply voltage in the internal voltage lowering circuit shown in FIG. 18.
Figure 21:
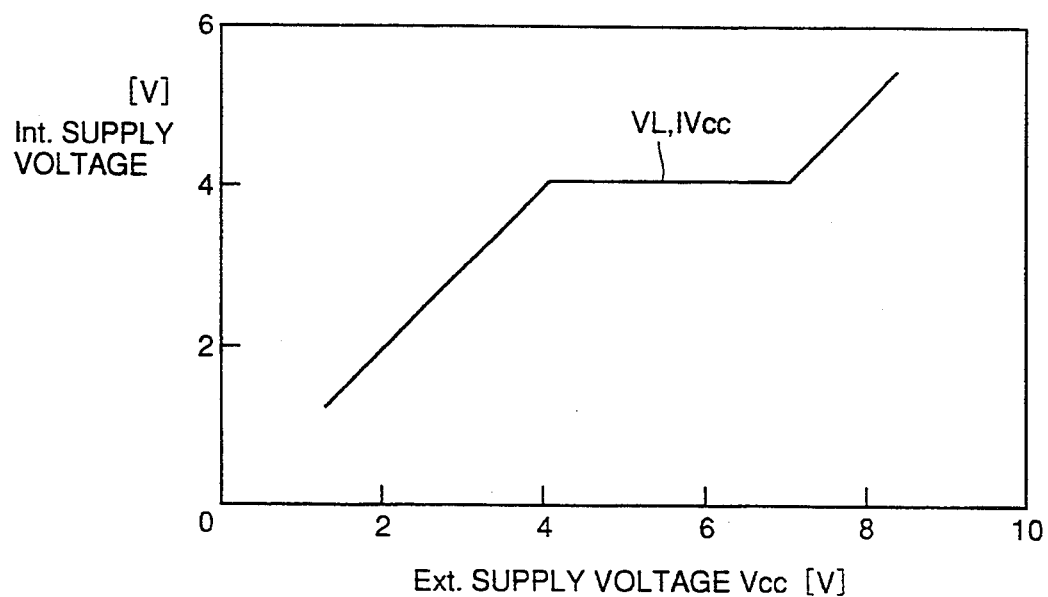
FIG. 21 shows characteristics of the internal supply voltage in the internal voltage lowering circuit shown in FIG. 18.

Internal voltage lowering circuit 60 has the similar structure as the internal voltage lowering circuit shown in FIG. 18, and supplies the lowered internal supply voltage $IV_{CC}$ to a prescribed circuit block.

Figure 1:
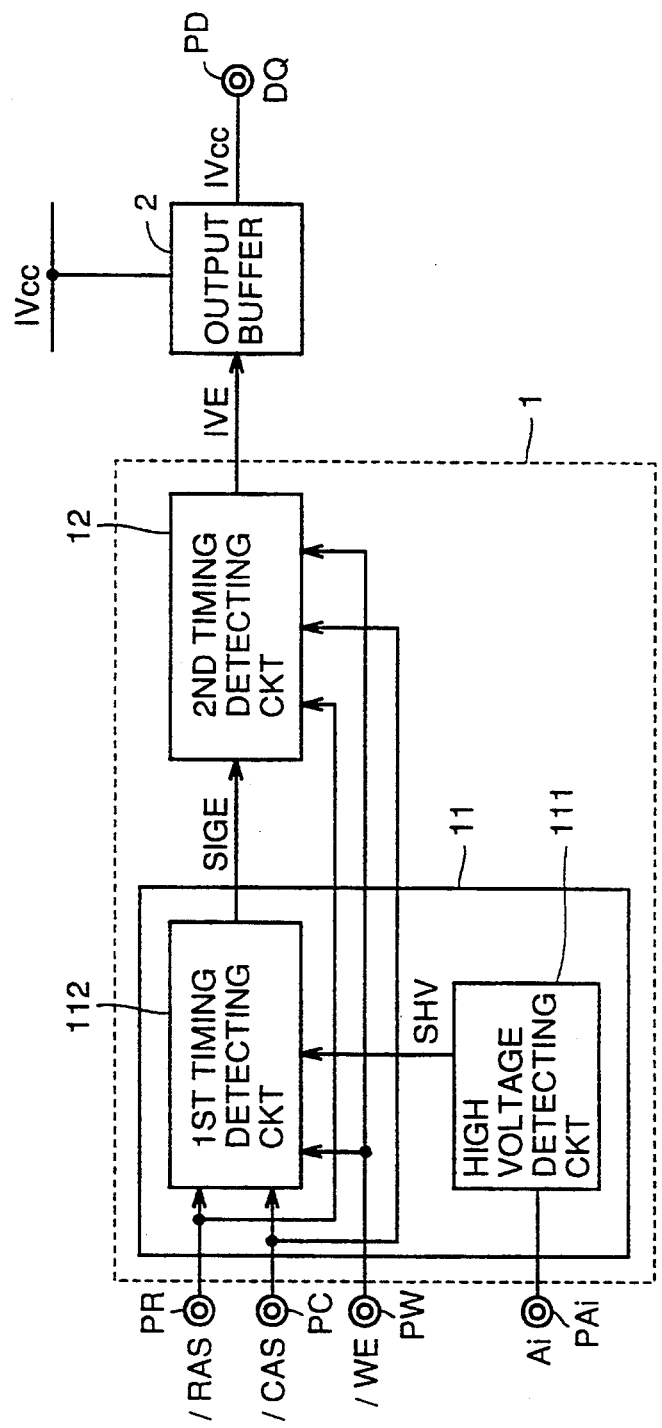
FIG. 1 is a block diagram showing a structure of a monitoring portion of the semiconductor device in accordance with a first embodiment of the present invention.

A monitoring portion (status detecting circuit 1 and a part of the output buffer 59) which is the main portion of the present invention will be described in detail with respect to the figures. FIG. 1 is a block diagram showing a structure of the monitoring portion of the semiconductor device in accordance with the first embodiment of the present invention. In FIG. 1, output buffer 2 represents only those portions of the output buffer 59 shown in FIG. 28 which are directly related to the present invention.

Referring to FIG. 1, the monitoring portion of the semiconductor device includes a status detecting circuit 1 for detecting the status of the external control signal input through an external pin and outputting an output buffer activating signal IVE in accordance with the status of the external control signal; and an output buffer 2 responsive to the output buffer activating signal IVE for providing the internal supply voltage $IV_{CC}$ which is obtained by lowering the external supply voltage $V_{CC}$ by internal voltage lowering circuit 60, to the external pin. Status detecting circuit 1 includes a signature mode signal generating circuit 11 and a second timing detecting circuit 12. Signature mode signal generating circuit 11 includes a first timing detecting circuit 112 and a high voltage detecting circuit 111.

To the first and second timing detecting circuits 112 and 12, prescribed external control signals are input. Here, a row address strobe signal /RAS, a column address strobe signal /CAS and a write enable signal /WE are input, for example, assuming that the device is a DRAM. To high voltage detecting circuit 111, a signal having a high voltage V, which is higher than the "H" (high potential) level input normally, is input. Here, as the device is a DRAM, an address signal Ai is input through an external pin PAi, which is one of the address input pins, used as an input pin. High voltage detecting circuit 111 outputs, when it detects the address signal Ai being a high voltage V, a high voltage detecting signal SHV to first timing detecting circuit 112.

First timing detecting circuit 112 provides a signature mode signal SIGE indicating the setting to a mode for monitoring the internal supply voltage $IV_{CC}$ to second timing detecting circuit 12 when the row address strobe signal /RAS, the column address strobe signal /CAS, the write enable signal /WE and the high voltage detecting signal SHV satisfy a predetermined timing condition. Second timing detecting circuit 12 is activated in response to the signature mode signal SIGE. The activated second timing detecting signal 12 provides an output buffer activating signal IVE to output buffer 2 for activating output buffer 2, in response to the timing condition of the row address strobe signal /RAS, the column address strobe signal /CAS and the write enable signal /WE.

Figure 2:
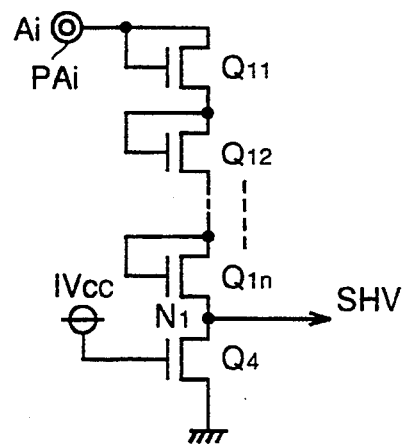
FIG. 2 is a schematic diagram showing a structure of the first example of a high voltage detecting circuit shown in FIG. 1.

High voltage detecting circuit 111 will be described in detail with respect to the figures. FIG. 2 is a schematic diagram showing a structure of the first example of high voltage detecting circuit 111.

Referring to FIG. 2, high voltage detecting circuit 111 includes n channel MOS transistors Q11 to Q1n and Q4. Transistor Q11 has its drain and gate connected to an external pin PAi. Transistor Q12 has its drain and gate connected to the source of transistor Q11. A total of n transistors Q11 to Q1n are connected in the similar manner as transistor Q12. Transistor Q1n has its source connected to the drain of transistor Q4 at a node N1, and the high voltage detecting signal SHV is output from node N1. Transistor Q4 has its gate connected to the internal supply voltage $IV_{CC}$ and its source connected to the ground potential. Here, the number n of transistors Q11 to Q1n is set so as to satisfy the relation of $n \cdot V_{t1} > V_{CC}$, where $V_{t1}$ represents the threshold voltage of the transistors Q11 to Q1n. The on resistance of transistor Q4 is set high enough to provide a signal having the level of $V - n \cdot V_{t1}$ at node N1 when a high voltage V is input to the external pin PAi.

When a signal of "L" (ground potential), which is a normal input signal, is input to the address pin PAi, transistors Q11 to Q1n are not turned on. Meanwhile, node N1 is at "L" because of transistor Q4 which is normally on, and the high voltage detecting signal SHV is at "L".

Even when a normal input signal of "H" ($V_{CC}$ level) is input to the address pin PAi, not all of the transistors Q11 to Q1n are turned on, and the high voltage detecting signal SHV is at "L" as in the above described case.

Then, when a high voltage V which is higher than "H" of the normal input signal, for example a signal having the voltage of $V_{CC}+n·V_{t1}$ is applied to the external pin PAi, transistors Q11 to Q1n are all turned on, and the potential of node N1 attains to the $V_{CC}$ level. At this time, since the on resistance of transistor Q4 is sufficiently high, node N1 continuously outputs the signal of the $V_{CC}$ level as long as the high voltage V is continuously input to the external pin PAi, so that the high voltage detecting signal SHV attains "H".

Figure 3:
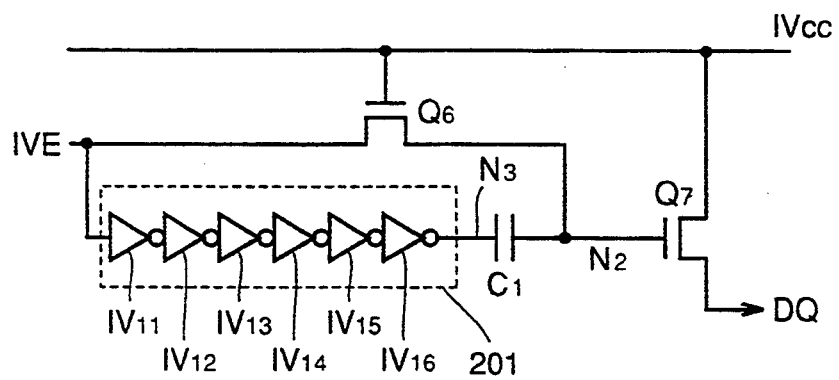
FIG. 3 is a schematic diagram showing a structure of the first example of an output buffer shown in FIG. 1.

Output buffer 2 will be described in detail with reference to the figures. FIG. 3 is a schematic diagram showing a structure of the first example of output buffer 2.

Referring to FIG. 3, output buffer 2 includes n channel MOS transistors Q6 and Q7, a capacitor C1 and a delay circuit 201. Delay circuit 201 includes inverters IV11 to IV16. The threshold voltage of transistors Q6 and Q7 is $V_{t2}$.

To the source of transistor Q6, an output buffer activating signal IVE provided from the second timing detecting circuit 12 is input, and to the gate, the internal supply voltage $IV_{CC}$ is applied. Transistor Q6 has its drain connected to the gate of transistor Q7. Transistor Q7 has its drain connected to the internal supply voltage $IV_{CC}$. Output buffer activating signal IVE is input to delay circuit 201. Capacitor C1 is connected to delay circuit 201 as well as to the gate of transistor Q7.

The operation of output buffer 2 structured as above will be described. When the output buffer activating signal IVE is at "L", the potential at node N2 will be "L" because of the transistor Q6 which is normally on. At this time, transistor Q7 is off and the internal supply voltage $IV_{CC}$ is not output.

When the output buffer activating signal IVE attains to "H" ($IV_{CC}$ level), node N2 attains to $IV_{CC}-V_{t2}$ because of the transistor Q6. After the lapse of a prescribed time period, node N3 attains to "H" ($IV_{CC}$ level), and the potential at node N2 is boosted to $2·IV_{CC}-V_{t2}$. Here, if the threshold voltage $V_{t2}$ is set to satisfy the condition of $2·IV_{CC}-V_{t2}>IV_{CC}+V_{t2}$, the transistor Q7 is fully turned on, and provides an output signal DQ of the level of the internal supply voltage $IV_{CC}$. Therefore, if the drain of the transistor Q7 is connected to the external pin PD, the output signal DQ having the level of the internal supply voltage $IV_{CC}$ is directly provided to the external pin PD. Here, taking the DRAM as an example, a Q pin providing normal data is used as the external pin PD.

Figure 4:
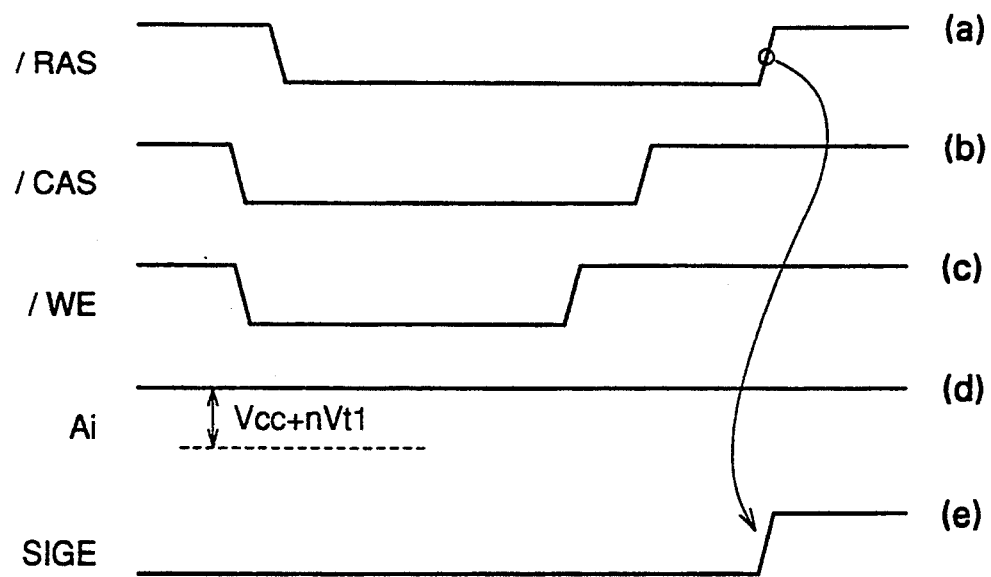
FIG. 4 is a timing chart showing a signature mode set timing of a status detecting circuit shown in FIG. 1.

Now, the above described series of operations will be described with reference to a timing chart. FIG. 4 is a timing chart showing the signature mode set timing.

To external pins PR, PC, and PW, the row address strobe signal /RAS, the column address strobe signal /CAS and the write enable signal /WE are respectively input at the timing of WCBR (WE, CAS Before RAS). The WCBR timing refers to the timing condition in which the column address strobe signal /CAS and the write enable signal /WE are input at the "L" level prior to the row address strobe signal /RAS, and then the row address strobe signal /RAS is set to "L". The WCBR timing is used in the DRAM when the test mode is entered. Simultaneously with the aforementioned WCBR timing, an address signal Ai at the level of $V_{CC}+n·V_{t1}$ which is a high voltage higher than the normal input signal, is input to the external pin PAi. At this time, in response to the rise of the row address strobe signal /RAS, the signature mode signal SIGE attains to "H" ($IV_{CC}$ level). Once set, the signature mode signal SIGE is kept at "H" ($IV_{CC}$ level) until a reset timing which will be described later is entered, even if the address signal Ai of the high voltage $V_{CC}+n·V_{t1}$ level is not input. Since the signature mode set timing is set in accordance with the WCBR timing as described above, it is possible to set the signature mode at the same timing as the test mode of the device.

Figure 5:
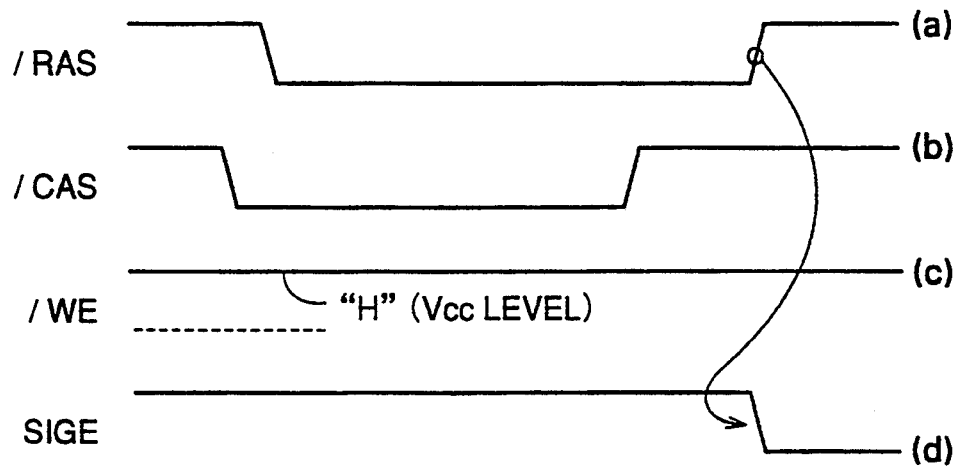
FIG. 5 is a timing chart showing a signature mode reset timing of the status detecting circuit shown in FIG. 1.

FIG. 5 is a timing chart showing the signature mode reset timing. The write enable signal /WE and the column address strobe signal /CAS are input at "H" ($V_{CC}$ level). Then, when the row address strobe signal /RAS rises from "L" to "H", the signature mode signal SIGE attains "L", thus resetting the signature mode.

Alternatively, the signature mode may be reset in accordance with the following manner. First, the write enable signal /WE is input at "H" ($V_{CC}$ level). Then, the column address strobe signal /CAS at "L" is input prior to the row address strobe signal /RAS, and then the row address strobe signal /RAS rises from "L" to "H". In response to the timing of rise, the signature mode signal SIGE attains to "L", resetting the signature mode.

As described above, the signature mode is reset at the timing of ROR (RAS Only Refresh) or the CBR (CAS Before RAS). The ROR and CBR timing are standard cycles for carrying out refreshing operation in a common DRAM. It is not necessary to carry out the signature mode for monitoring the internal voltage during the refreshing operation, and when the signature mode is adapted to be reset in the refresh cycle, it becomes not necessary to generate new reset timing. This can simplify the structure of the peripheral system equipments such as the DRAM controller, and prevents erroneous operation. Since the reset of the test mode is also carried out at the timing of ROR or CBR, it is well in accordant with the existing system operation.

Figure 22:
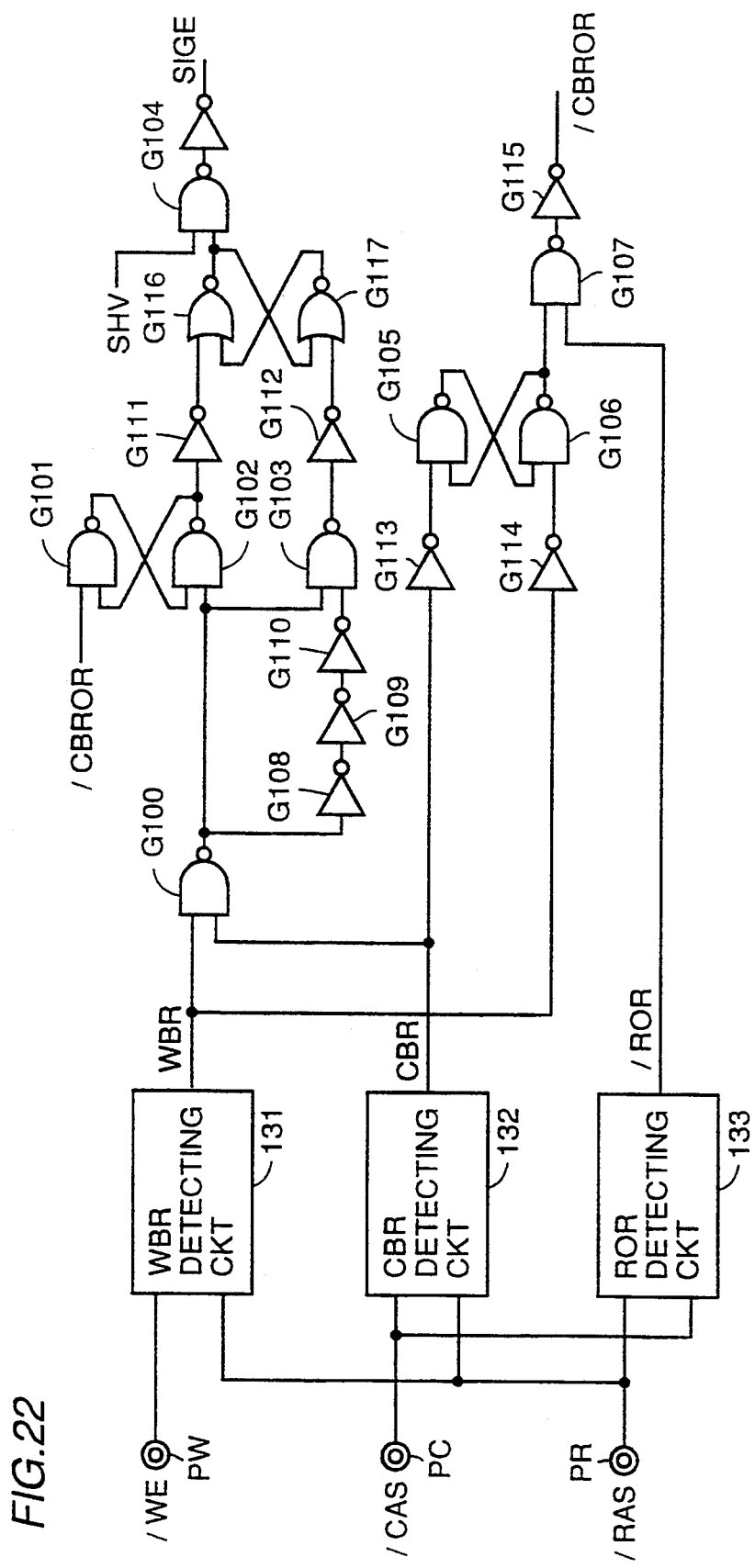
FIG. 22 shows a structure of a first timing detecting circuit shown in FIG. 1.

The first timing detecting circuit 112 realizing the above-described setting or resetting timing of the signature mode will be described with reference to the figures. FIG. 22 shows the structure of the first timing detecting circuit 112. Referring to FIG. 22, the first timing detecting circuit 112 includes a WBR detecting circuit 131 for detecting earlier rise of the write enable signal /WE than the row address strobe signal /RAS; a CBR detecting circuit 132 for detecting earlier rise of the column address strobe signal /CAS than the row address strobe signal /RAS; an ROR detecting circuit 133 for detecting the ROR timing; NAND gates G100 to G107; inverters G108 to G115; and NOR gates G116 and G117.

WBR detecting circuit 131 and CBR detecting circuit 132 are similar to a generally used circuit for carrying out refreshing operation at the CBR timing. An output signal WBR provided from WBR detecting circuit 131 attains to "H" when the write enable signal /WE rises earlier than the row address strobe signal /RAS, and it attains to "L" when the row address strobe signal /RAS rises. An output signal CBR provided from CBR detecting circuit 132 attains to "H" when the column address strobe signal /CAS rises earlier than the row address strobe signal /RAS and it attains to "L" when the row address strobe signal /RAS rises. An output signal /ROR provided from ROR detecting circuit 133 attains to "L" upon detection of the ROR timing, and it attains to "H" when the row address strobe signal /RAS rises. An output signal /CBROR from inverter G115 attains to "L" in response to the CBR or ROR timing. By the above described structure, first timing detecting circuit 112 can realize setting or resetting timing of the signature mode.

Figure 6:
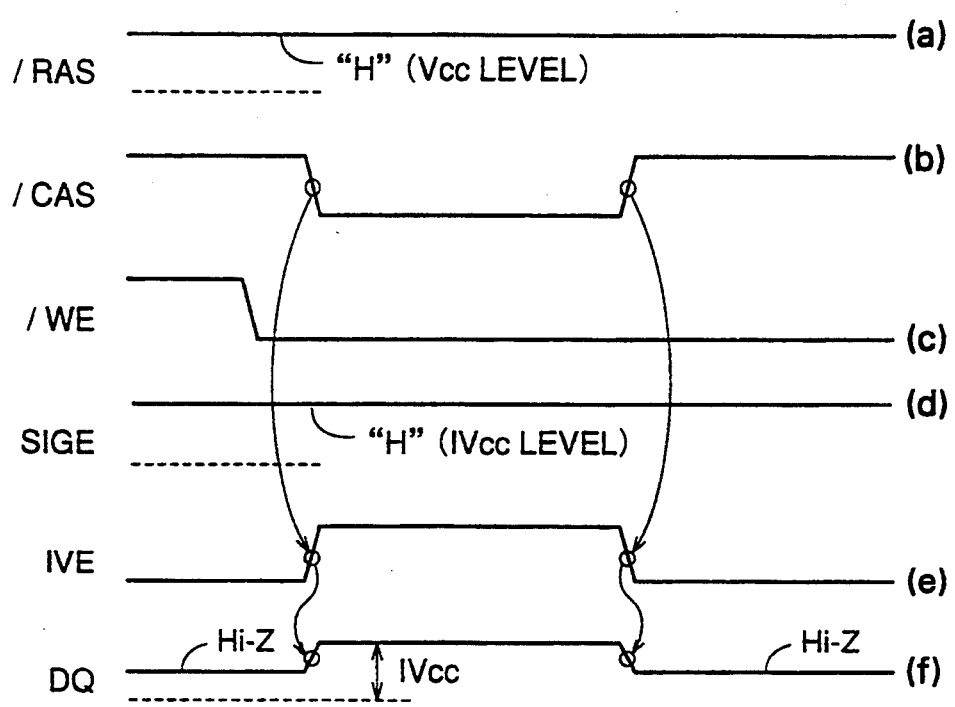
FIG. 6 is a timing chart showing a first internal voltage monitoring timing of the status detecting circuit shown in FIG. 1.

The internal voltage monitoring timing will be described. FIG. 6 shows the first internal voltage monitoring timing.

The row address strobe signal /RAS at "H" is input while the signature mode is set. Then, the write enable signal /WE at "L" is input, and then the column address strobe signal /CAS of "L" is input. At this time, the second timing detecting circuit 12 sets the output buffer activating signal IVE to "H" ($IV_{CC}$ level), and thus the output buffer 2 is activated. The activated output buffer 2 provides an output signal DQ of the internal supply voltage $IV_{CC}$ to external pin PD, so that the internal supply voltage $IV_{CC}$ can be directly monitored.

Then, when the column address strobe signal /CAS is set to "H", second timing detecting circuit 12 sets the output buffer activating signal IVE to "L", so that output buffer 2 is inactivated. Therefore, the output signal DQ of the internal supply voltage $IV_{CC}$ is not provided at the external pin PD, and Hi-Z (high impedance) state is set.

Figure 23:
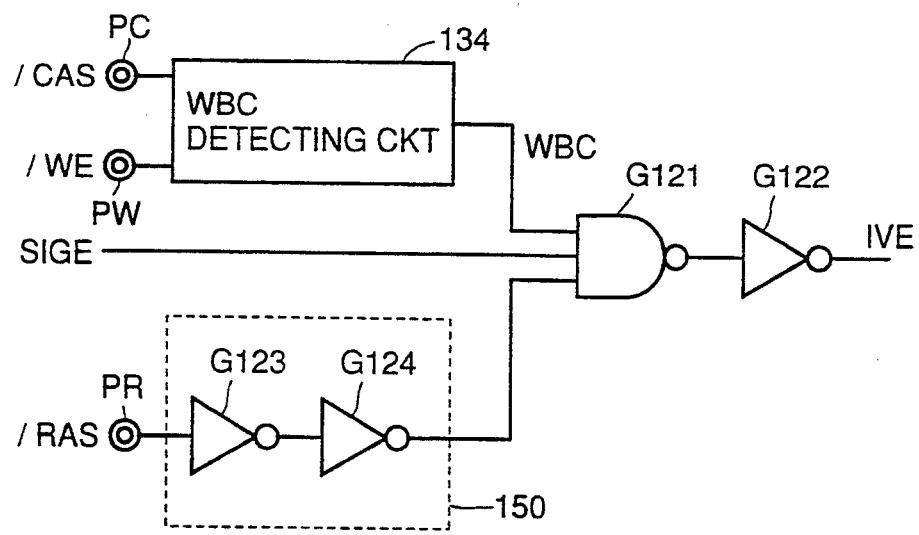
FIG. 23 shows a structure of the first example of a second timing detecting circuit shown in FIG. 1.

The second timing detecting circuit 12 realizing the above mentioned first internal voltage monitoring timing will be described with reference to the figures. FIG. 23 shows a structure of a first example of the second timing detecting circuit 12.

Referring to FIG. 23, second timing detecting circuit 12 includes an WBC detecting circuit 134, an input buffer 150, an NAND gate G121 and an inverter G122. Input buffer 150 includes inverters G123 and G124.

WBC detecting circuit 134 provides an output signal WBC which attains to "H" when the write enable signal /WE rises earlier than the column address strobe signal /CAS and attains to "L" when the column address strobe signal /CAS rises. WBC detecting circuit 134 has the similar structure as CBR detecting circuit 132 shown in FIG. 22, in which the column address strobe signal /CAS is replaced by the write enable signal /WE and the row address strobe signal /RAS is replaced by the column address strobe signal /CAS. The row address strobe signal /RAS is input to the NAND gate G121 through input buffer 150. An output signal from NAND gate G121 is provided as the output buffer activating signal IVE through inverter G122.

Figure 7:
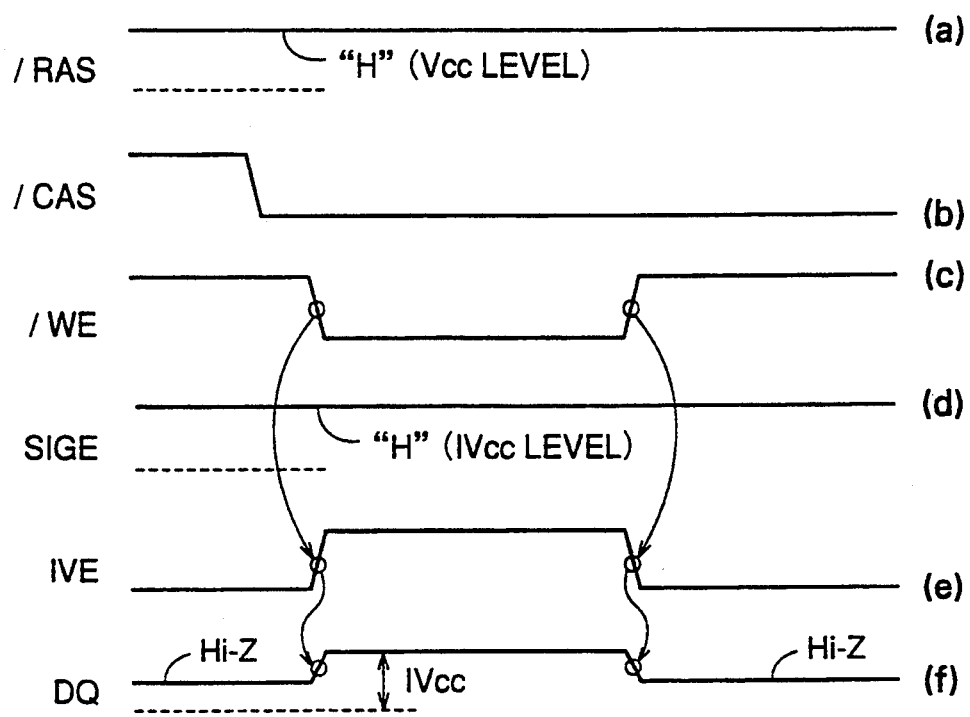
FIG. 7 is a timing chart showing a second internal voltage monitoring timing of the status detecting circuit shown in FIG. 1.

The second internal voltage monitoring timing will be described. FIG. 7 shows the second internal voltage monitoring timing.

By changing connection between the column address strobe signal /CAS and the write enable signal /WE of the second timing detecting circuit 12, the internal supply voltage $IV_{CC}$ can be directly monitored at the timing shown in FIG. 7.

Figure 24:
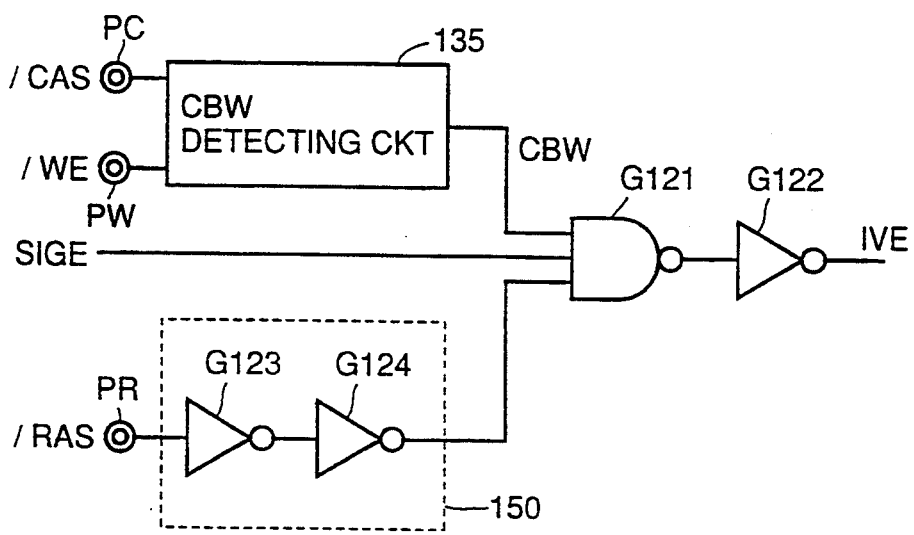
FIG. 24 shows a structure of a second example of a second timing detecting circuit shown in FIG. 1.

The second timing detecting circuit realizing the aforementioned second internal voltage monitoring timing will be described with reference to the figures. FIG. 24 shows a structure of the second example of the second timing detecting circuit realizing the second internal voltage monitoring timing shown in FIG. 7. It is different from the second timing detecting circuit 12 of FIG. 23 in that the write enable signal /WE and the column address strobe signal /CAS are replaced by each other to be input to CBW detecting circuit 135.

As for the internal voltage monitoring timing mentioned above, any other timing may be used provided that it does not reset the signature mode.

Figure 8:
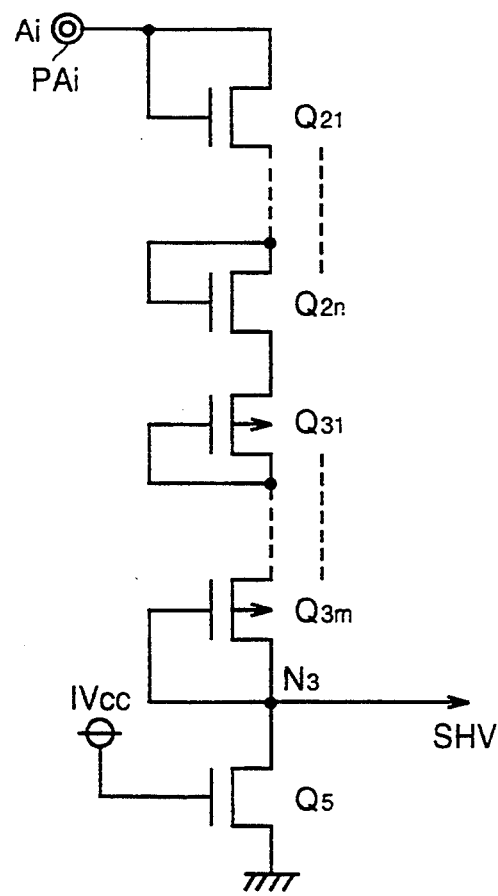
FIG. 8 is a schematic diagram showing a structure of a second example of the high voltage detecting circuit shown in FIG. 1.

The second example of high voltage detecting circuit 111 shown in FIG. 1 will be described. FIG. 8 shows a structure of the second example of high voltage detecting circuit 111. Referring to FIG. 8, the high voltage detecting circuit includes a plurality (n) of n channel MOS transistors Q21 to Q2n having their drains and gates short-circuited, m p channel MOS transistors Q31 to Q3m having their drains and gates short-circuited, and a n channel MOS transistor Q5. n channel MOS transistors Q21 to Q2n and p channel MOS transistors Q31 to Q3m are connected in series. The n channel MOS transistor Q5, receiving at its gate the internal supply voltage $IV_{CC}$ and having its source connected to the ground potential, has its drain connected to the drain of the last transistor Q3m of the serially connected m+n transistors, at node N3. n channel MOS transistor Q21 has its gate and drain connected to the external pin PAi. The threshold voltage of each of the transistors Q21 to Q2n is $V_{t3}$, the threshold voltage of each of the transistors Q31 to Q3m is $V_{t4}$ and the values are set such that $n \cdot V_{t3} + m \cdot V_{t4} > V_{CC}$. The on resistance of transistor Q5 is made sufficiently high so that $V - n \cdot V_{t3} - m \cdot V_{t4}$ is provided at node N3 when the high voltage V is input to the external pin PAi. In the above-described structure, the high voltage detecting circuit shown in FIG. 8 operates in the same manner as the high voltage detecting circuit 111 shown in FIG. 2. Even when a normal input signal of "L" or "H" is input to the external pin PAi, the potential at node N3 is at the ground potential, so that the high voltage detecting signal SHV will be "L". Meanwhile, if a high voltage V, for example, $V_{CC} + n \cdot V_{t3} + m \cdot V_{t4}$ which is higher than the level of "H" of the normal input signal, is provided at the external pin PAi, the node N3 attains to $V_{CC}$ level, so that the high voltage detecting signal SHV attains "H". In FIG. 8, as for the order of connection of n channel MOS transistors Q22 to Q2n and p channel MOS transistors Q31 to Q3m other than the n channel MOS transistor Q21 connected to the external pin PAi, any other order may be employed.

Figure 9:
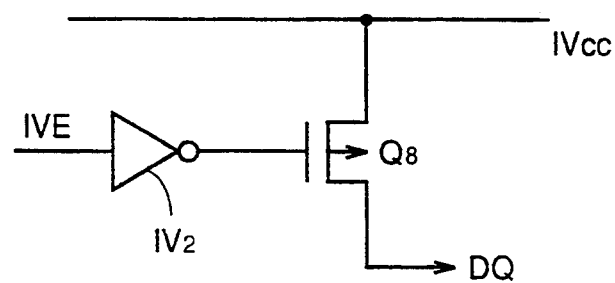
FIG. 9 is a schematic diagram showing a structure of a second example of the output buffer shown in FIG. 1.

The second example of output buffer 2 will be described with reference to the figures. FIG. 9 shows a structure of the second example of output buffer 2.

Referring to FIG. 9, the output buffer includes an inverter IV2 and a p channel MOS transistor Q8. The transistor Q8 has its source connected to the internal supply voltage $IV_{CC}$ and has its drain connected to the external pin PD. An output signal from inverter IV2 which has received the output buffer activating signal IVE from the second timing detecting circuit 12 is input to the gate of p channel MOS transistor Q8.

The operation of the output buffer is as follows. When the output buffer activating signal IVE is at "L", the gate input of transistor Q8 attains to "H", turning off the transistor QS. Therefore, the internal supply voltage $IV_{CC}$ is not output to the drain of transistor Q8. Meanwhile, when the output buffer activating signal IVE attain to "H" ($IV_{CC}$ level), the gate input of transistor Q8 attains to "L", turning on the transistor Q8. Thus the output signal DQ of the internal supply voltage $IV_{CC}$ is provided at the drain of transistor Q8.

Figure 29:
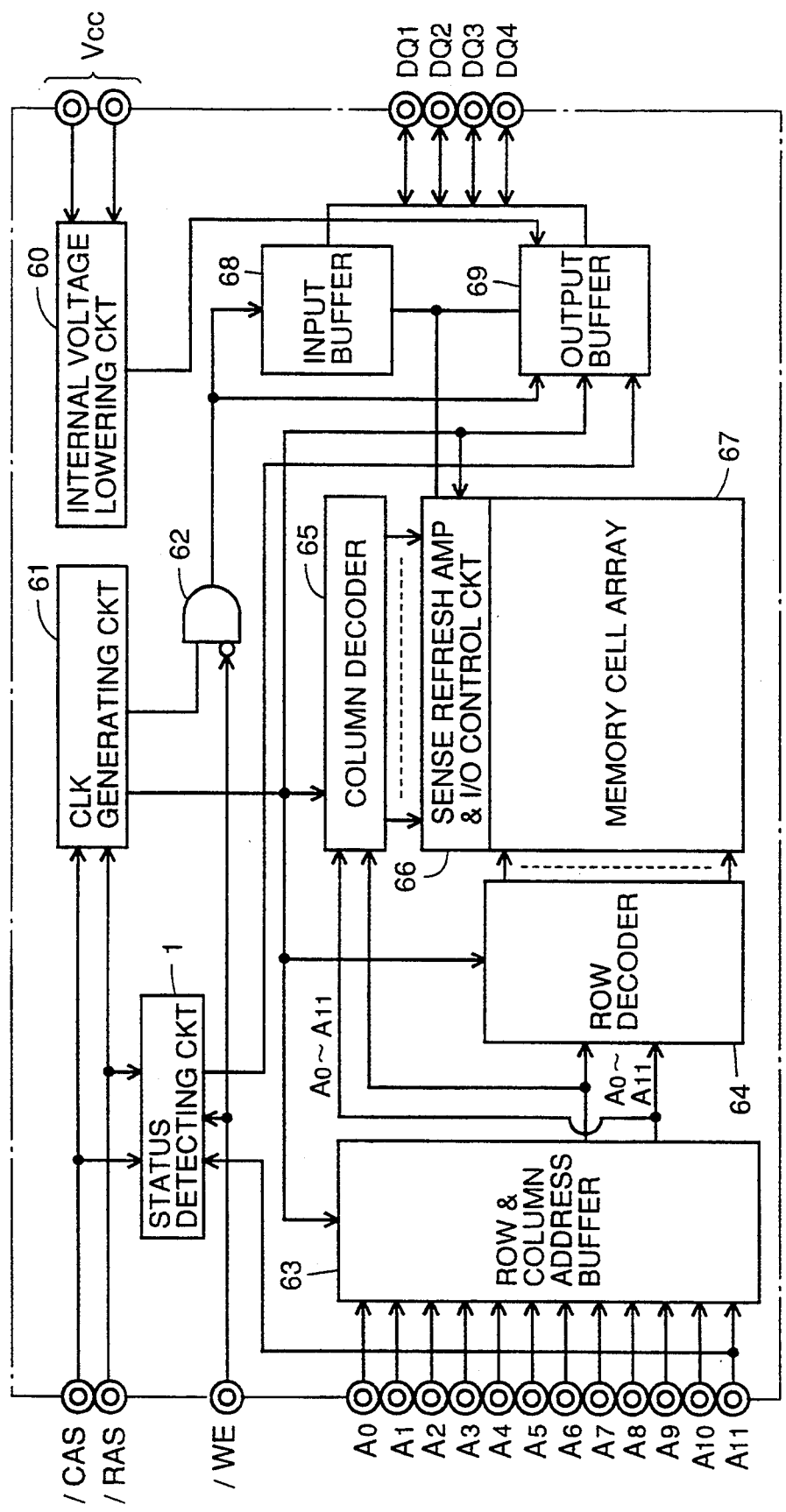
FIG. 29 is a block diagram showing the structure of the semiconductor device in accordance with a second embodiment of the present invention.

The semiconductor device in accordance with the second embodiment of the present invention will be described. FIG. 29 shows the whole structure of the semiconductor device in accordance with the second embodiment of the present invention. In FIG. 29, a DRAM having a 4-bit structure is shown as a semiconductor device of the second embodiment.

Referring to FIG. 29, the semiconductor device includes a status detecting circuit 1, a clock generating circuit 61, a gate 62, a row and column address buffer 63, a row decoder 64, a column decoder 65, a sense refresh amplifier and input/output control circuit 66, a memory cell array 67, an input buffer 68, an output buffer 69 and an internal voltage lowering circuit 60. The DRAM differs from that of FIG. 28 in that data input/output is carried out on 4 bits basis, and four DQ pins, which are input/output pins, are used. Therefore, one input/output pin of the DQ pins is used as the external pin PD for outputting the internal supply voltage $IV_{CC}$. The same circuits as in the above embodiments are applied to the status detecting circuit 1 and the output buffer 69, and they operate in the similar manner.

In the first embodiment of the status detecting circuit shown in FIG. 1, the status has been detected by inputting a high voltage to at least one external pin (for example an address pin) other than the three external control signals /RAS, /CAS and /WE. However, it is possible to set the signature mode by using only the three external control signals /RAS, /CAS and /WE and to monitor the internal supply voltage $IV_{CC}$ directly by providing the internal supply voltage at a certain external pin (for example, a DQ pin).

Figure 10:
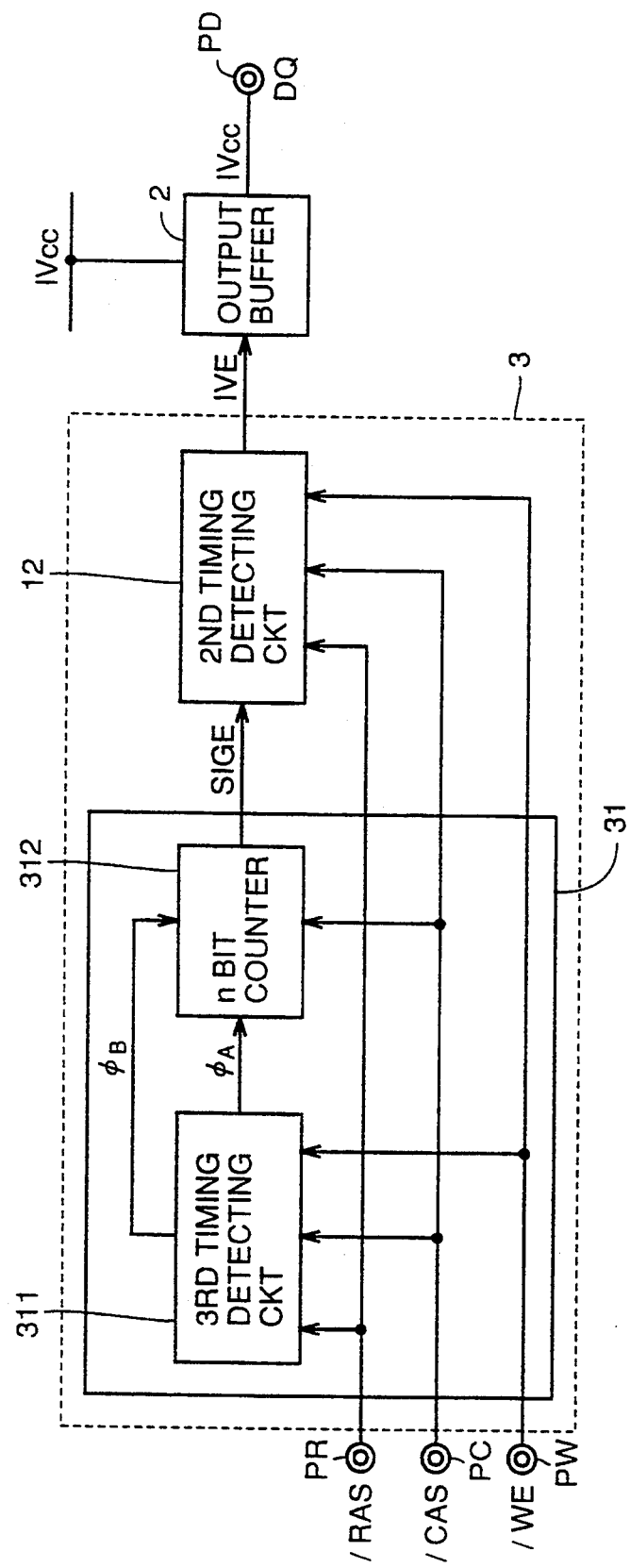
FIG. 10 is a block diagram showing a structure of a monitoring portion of the semiconductor device in accordance with a third embodiment of the present invention.

A semiconductor device having a status detecting circuit which realizes the signature mode by using only the three external control signals /RAS, /CAS and /WE will be described with reference to the figure, as the semiconductor device in accordance with the third embodiment of the present invention. FIG. 10 is a block diagram showing the structure of the monitoring portion of the semiconductor device in accordance with the third embodiment of the present invention.

Referring to FIG. 10, the monitoring portion of the semiconductor device includes a status detecting circuit 3 and an output buffer 2. Status detecting circuit 3 includes a signature mode signal generating circuit 31 and a second timing detecting circuit 12. Signature mode signal generating circuit 31 includes a third timing detecting circuit 311 and an n bit counter 312. The second timing detecting circuit 12 and the output buffer 2 are the same as those of FIG. 1, so that descriptions thereof are not repeated.

Figure 25:
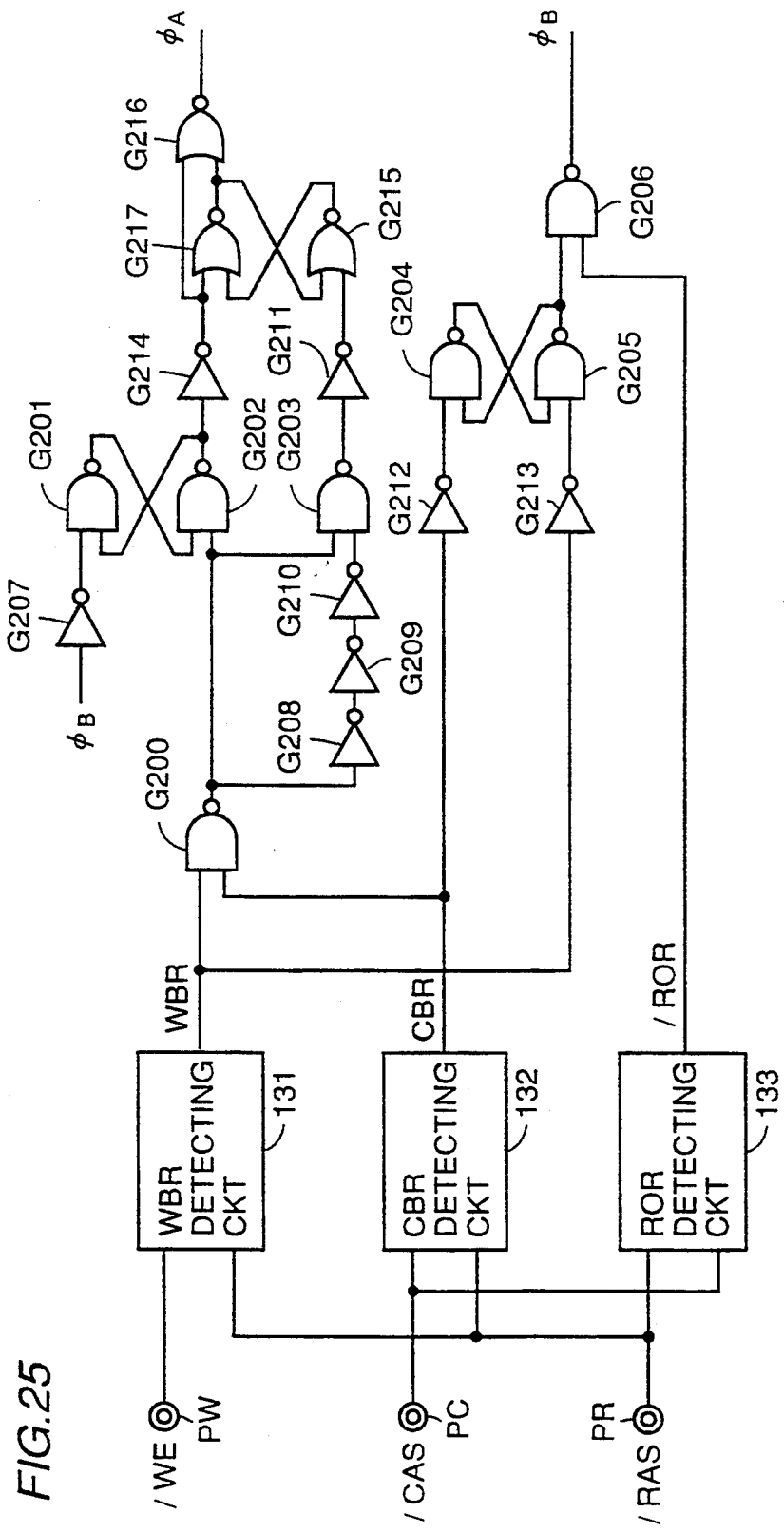
FIG. 25 shows a structure of a third timing detecting circuit shown in FIG. 10.

The third timing detecting circuit 311 will be described. FIG. 25 shows the structure of the third timing detecting circuit 311. Third timing detecting circuit 311 includes a WBR detecting circuit 331, a CBR detecting circuit 132, a ROR detecting circuit 133, NAND gates G200 to G206, inverters G207 to G214 and NOR gates G215 to G217. The structures and operations of WBR detecting circuit 131, CBR detecting circuit 132 and ROR detecting circuit 133 are the same as those of the circuit shown in FIG. 22.

Figure 11:
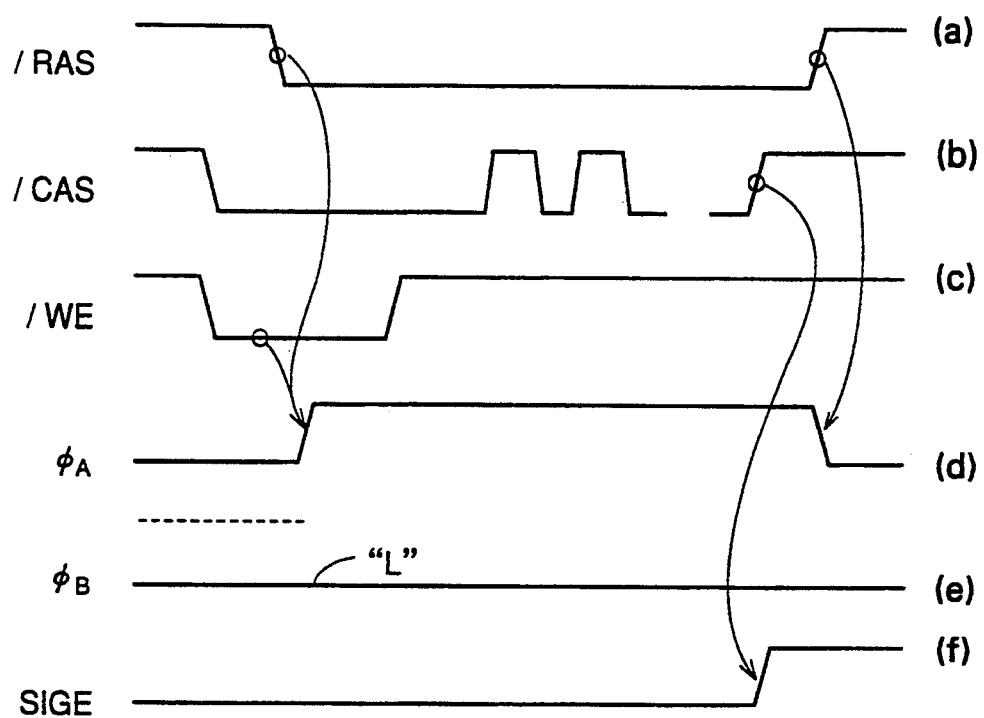
FIG. 11 is a timing chart showing the signature mode set timing of the status detecting circuit shown in FIG. 10.

The operation of the status detecting circuit 3 structured as described above will be described. First, the set timing of the signature mode will be described. FIG. 11 shows the signature mode set timing of the status detecting circuit shown in FIG. 10.

When the column address strobe signal /CAS and the write enable signal /WE are at "L" at the fall of the row address strobe signal /RAS, the third timing detecting circuit 311 generates a counter enable signal $\phi_A$. In response to the counter enable signal $\phi_A$, n bit counter 312 starts counting. When the set timing ends, n bit counter 312 is reset.

As an input signal of n bit counter 312, the column address strobe signal /CAS is input. When the operation of changing the column address strobe signal /CAS between "H" and "L" is repeated for $2^n$ times, a signature mode detecting signal SIGE provided from n bit counter 312 rises to "H".

Figure 12:
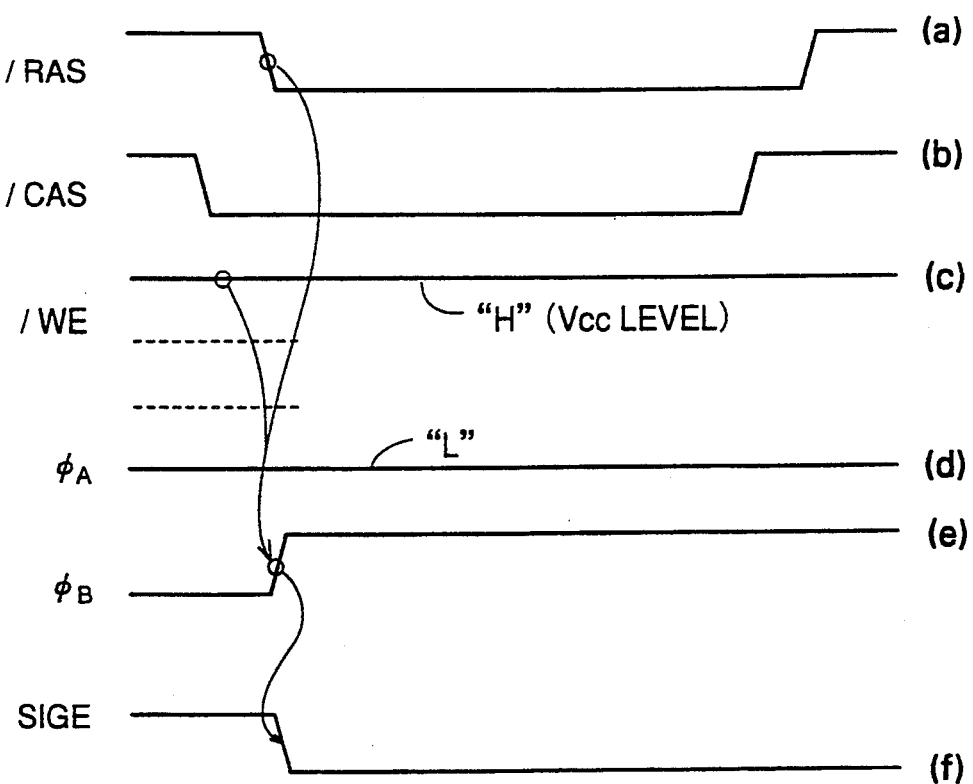
FIG. 12 is a timing chart showing the signature mode reset timing of the status detecting circuit shown in FIG. 10.

The signature mode reset timing will be described. FIG. 12 shows the signature mode reset timing. When the column address strobe signal /CAS is at "L" and the write enable signal /WE is at "H" at the rise of the row address strobe signal /RAS, the third timing detecting circuit 311 generates the signature mode reset signal $\phi_B$. At this time, the signature mode detecting signal SIGE falls to "L". Other than the above described timing, it may be reset at the ROR timing.

When the signature mode is set, the second timing detecting circuit 12 sets the output buffer activating signal IVE to "H" or "L" at the internal voltage monitoring timing shown in FIGS. 6 or 7. While the output buffer activating signal IVE is at "H", output buffer 2 provides the internal supply voltage $IV_{CC}$ to the external pin PD.

In the above embodiment, the signature mode is set by the toggling of the column address strobe signal /CAS based on the WCBR (WE, CAS Before RAS) timing. The signature mode is reset by the CBR (CAS Before RAS) or ROR (RAS only refresh) timing.

The timing for setting the signature mode is not limited to the above and any timing which is not generally recited in the product specification, that is, any timing which can be distinguished from the normal cycle timing, may be used.

In the above described embodiment, status detecting circuit 3 and output buffer 2 are driven by the internal supply voltage $IV_{CC}$. However, they may be driven by the external supply voltage $V_{CC}$. In that case, the "H" level of the signature mode detecting signal SIGE of FIGS. 6 and 7 is $V_{CC}$ level.

Although the method of monitoring and implementing the internal supply voltage lowered by the internal voltage lowering circuit have been described above, it may be also applied to monitor the internal boosted supply voltage $V_{PP}$, the reference voltage or the like generated in the semiconductor device or to monitor the potential of a supply line or a signal line.

Figure 13:
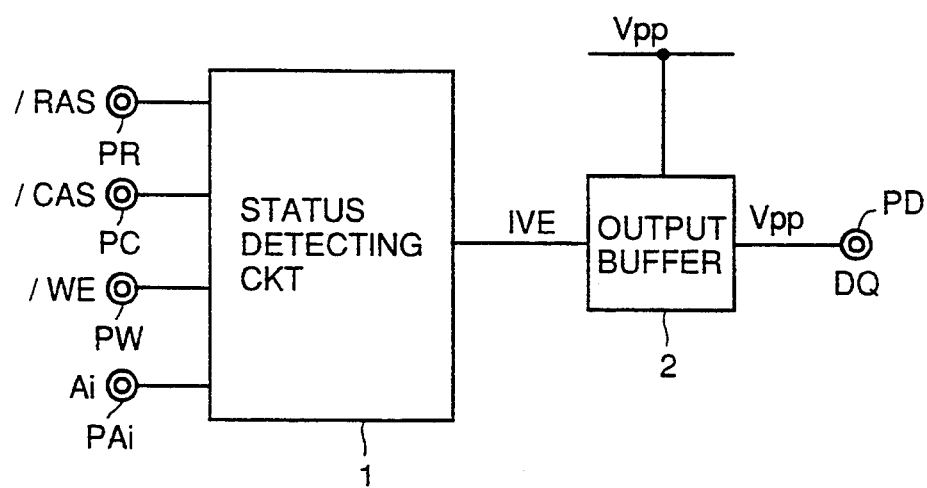
FIG. 13 is a block diagram showing the structure of the monitoring portion of the semiconductor device in accordance with a fourth embodiment of the present invention.

Monitoring of the internal boosted supply voltage $V_{PP}$ will be described. FIG. 13 shows a structure of a monitoring portion of a semiconductor device in accordance with the fourth embodiment for monitoring the internal boosted supply voltage $V_{PP}$. Referring to FIG. 13, the monitoring portion of the semiconductor device includes a status detecting circuit 1 and an output buffer 2. Status detecting circuit 1 has the similar structure as the status detecting circuit 1 shown in FIG. 1 which enters the signature mode in response to the external control signals /RAS, /CAS, /WE and Ai, and operates in the similar manner as the status detecting circuit 1 shown in FIG. 1. The status detecting circuit 3 shown in FIG. 10 may be used as the status detecting circuit 1. By the above structure, by setting the output buffer activating signal IVE to "H" or "L" in response to the similar timing as the internal voltage monitoring timing shown in FIGS. 6 or 7, the signal at the level of the internal boosted supply voltage $V_{PP}$ is output from output buffer 2 to the external pin PD (for example, DQ pin).

As for output buffer 2, the output buffer shown in FIG. 9 is used. Namely, the internal boosted supply voltage $V_{PP}$ may be connected to the source of transistor Q8. When other supply line or a signal line is to be monitored, the supply line or the signal line to be monitored should be connected to the source of transistor Q8 of the output buffer 2.

Figure 14:
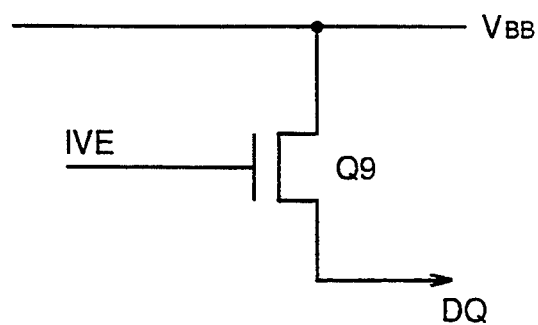
FIG. 14 is a schematic diagram showing a structure of an output buffer monitoring a negative voltage.

When a negative voltage such as the substrate bias $V_{BB}$ used in the DRAM is to be monitored, the output buffer shown in FIG. 14 may be used. FIG. 14 is a schematic diagram showing a structure of the output buffer for monitoring a negative voltage. Referring to FIG. 14, the output buffer includes an n channel MOS transistor Q9. The substrate bias $V_{BB}$ may be connected to the drain of transistor Q9 receiving at its gate the output buffer activating signal IVE, and the source of the transistor Q9 should be connected to the external pin for outputting the monitored voltage.

In each of the above embodiments, a structure in which voltage of one of the supply lines or signal lines to be monitored is provided to the external pin has been described. However, in this example, a plurality of monitored potentials can be output to the external pin.

Figure 15:
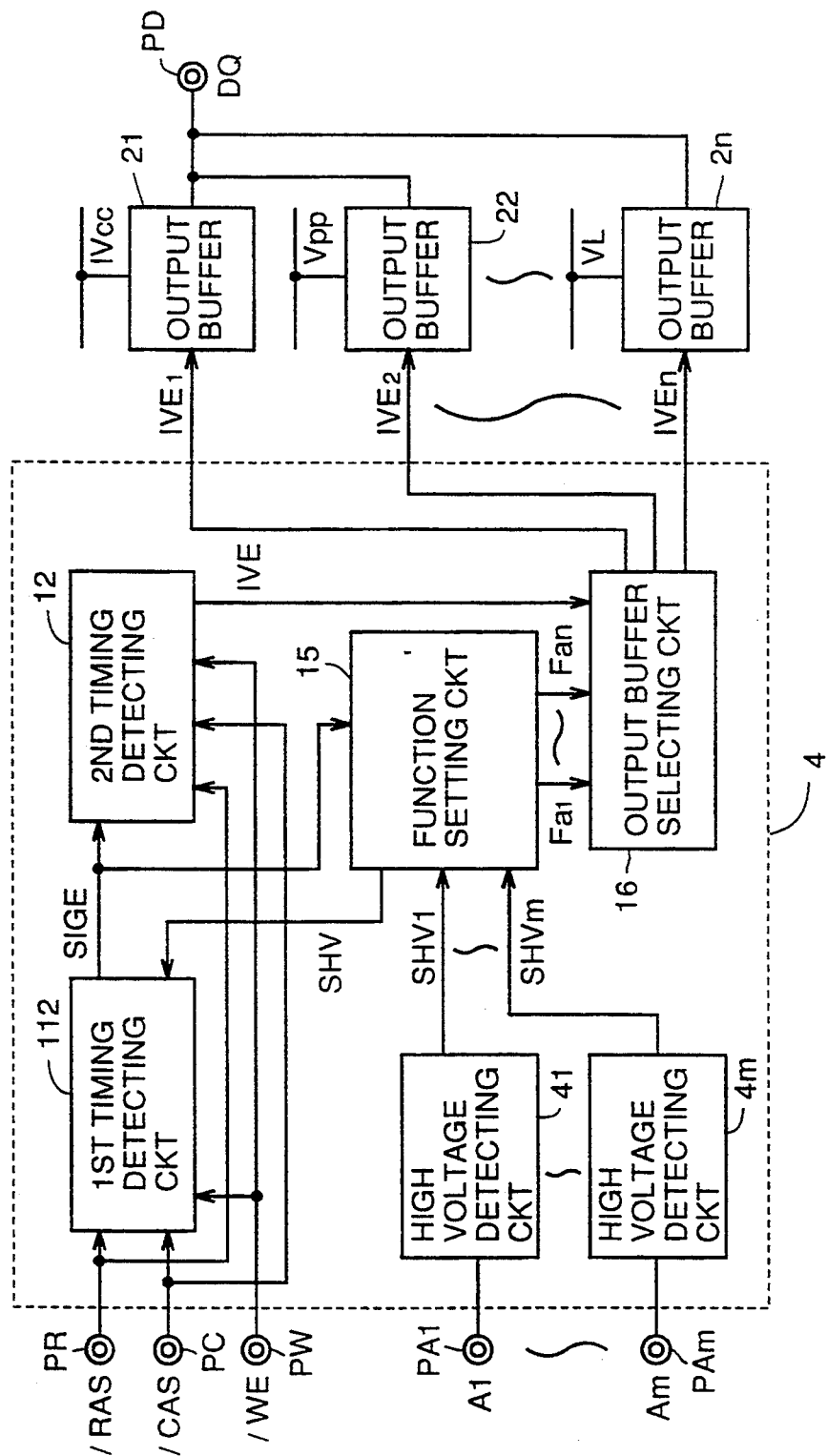
FIG. 15 is a block diagram showing a structure of the monitoring portion of the semiconductor device in accordance with the fifth embodiment of the present inventions.

A semiconductor device in accordance with the fifth embodiment in which a plurality of monitored potentials are output to an external pin will be described with reference to the figure. FIG. 15 is a block diagram showing a structure of a monitoring portion of the semiconductor device in accordance with the fifth embodiment.

Referring to FIG. 15, the monitoring portion of the semiconductor device includes a status detecting circuit 4 for detecting the status of the signal at the external pin, and a plurality of output buffers 21 to 2n providing a plurality of monitored potentials. Status detecting circuit 4 includes a first timing detecting circuit 112, a second timing detecting circuit 5, m high voltage detecting circuits 41 to 4m, a function setting circuit 15 and an output buffer selecting circuit 16.

To status detecting circuit 4 for detecting the status of the signal at the external pin, three external control signals /RAS, /CAS and /WE as well as a plurality of other signals (for example, address signals A1 to Am) at other external pins (for example, address pins PA1 to PAm) are input.

Other than the three external control signals input to status detecting circuit 4, the signals are respectively input to high voltage detecting circuits 41 to 4m, a high voltage higher than the "H" level of the normal input signal is input, and individual high voltage detecting signals SHV1 to SHVm are respectively output. The individual high voltage detecting signals SHV1 to SHVm are input to function setting circuit 15, and a high voltage detecting signal SHV which is an OR of high voltage detecting signals SHV1 to SHVm is input the first timing detecting circuit 112. Upon detection of the signature mode set timing, the first timing detecting circuit 112 sets the signature mode detecting signal SIGE to "H".

In response to the signature mode detecting signal SIGE, the second timing detecting circuit 12 is activated, and sets the output buffer activating signal IVE to "H" in accordance with the internal voltage monitoring timing shown in FIGS. 6 or 7.

The signature mode detecting signal SIGE is also input to function setting circuit 15. At this time, in accordance with the combination of "H" and "L" of the high voltage detecting signals SHV1 to SHVm, function setting circuit 15 outputs function setting signals $F_{a1}$ to $F_{an}$ to output buffer selecting circuit 16.

When the output buffer activating signal IVE is at "H", output buffer selecting circuit 16 provides individual output buffer activating signals $IVE_1$ to IVEn selected in accordance with the function signals $F_{a1}$ to $F_{an}$. The individual output buffer activating signals $IVE_1$ to $IVE_n$ are input to respective output buffers 21 to 2n providing the respective monitored potentials. That one of the buffers to which corresponding one of the individual output buffer activating signal $IVE_1$ to $IVE_n$ is input at the "H" level provides the monitored potential at the external pin PD (for example, DQ pin).

Figure 16:
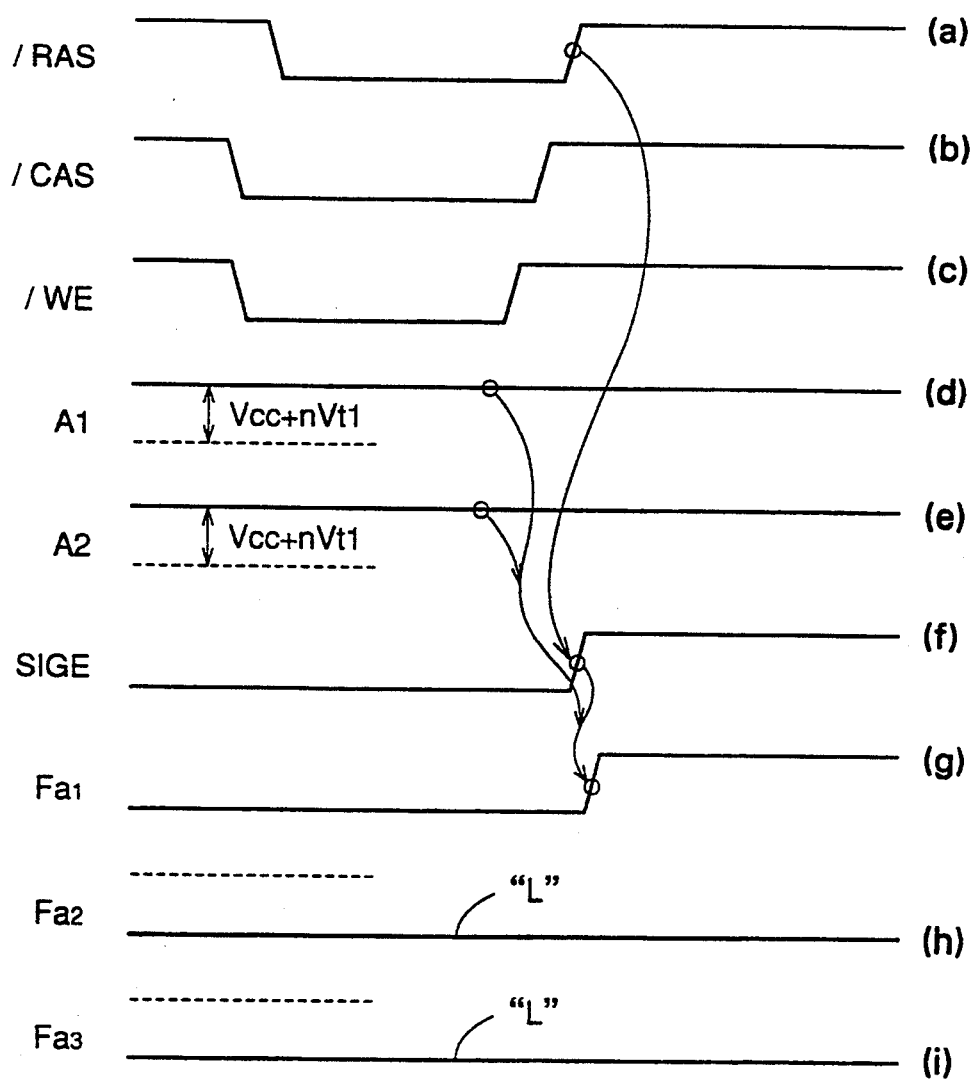
FIG. 16 is a timing chart showing a function setting timing of the status detecting circuit shown in FIG. 15.

The function setting timing will be described. FIG. 16 is a timing chart showing the function setting timing. For simplicity of description, in FIG. 16, two address signals A1 and A2 are input to two external pins PA-1and PA2 for function setting.

In this example, individual high voltage detecting signals SHV1 and SHV2 are output to the function setting circuit 15, so that there will be three combinations allowing setting of the function, that is, (SHV1="H", SHV2="H"), (SHV1="H", SHV2="L") and (SHV1="L", SHV2="H").

Function setting signals corresponding to the above mentioned three different combinations will be referred to as $F_{a1}$, $F_{a2}$ and $F_{a3}$, respectively. Function setting signals $F_{a1}$, $F_{a2}$ and $F_{a3}$ are in one to one correspondence with the monitored potentials $IV_{CC}$, $V_{PP}$ and VL. More specifically, when function setting signal $F_{a1}$ is at "H", the internal supply voltage $IV_{CC}$ is monitored, when function setting signal $F_{a2}$ is "H", the internal boosted supply voltage $V_{PP}$ is monitored, and when the function setting signal $F_{a3}$ is at "H", the reference voltage VL is monitored.

Figure 26:
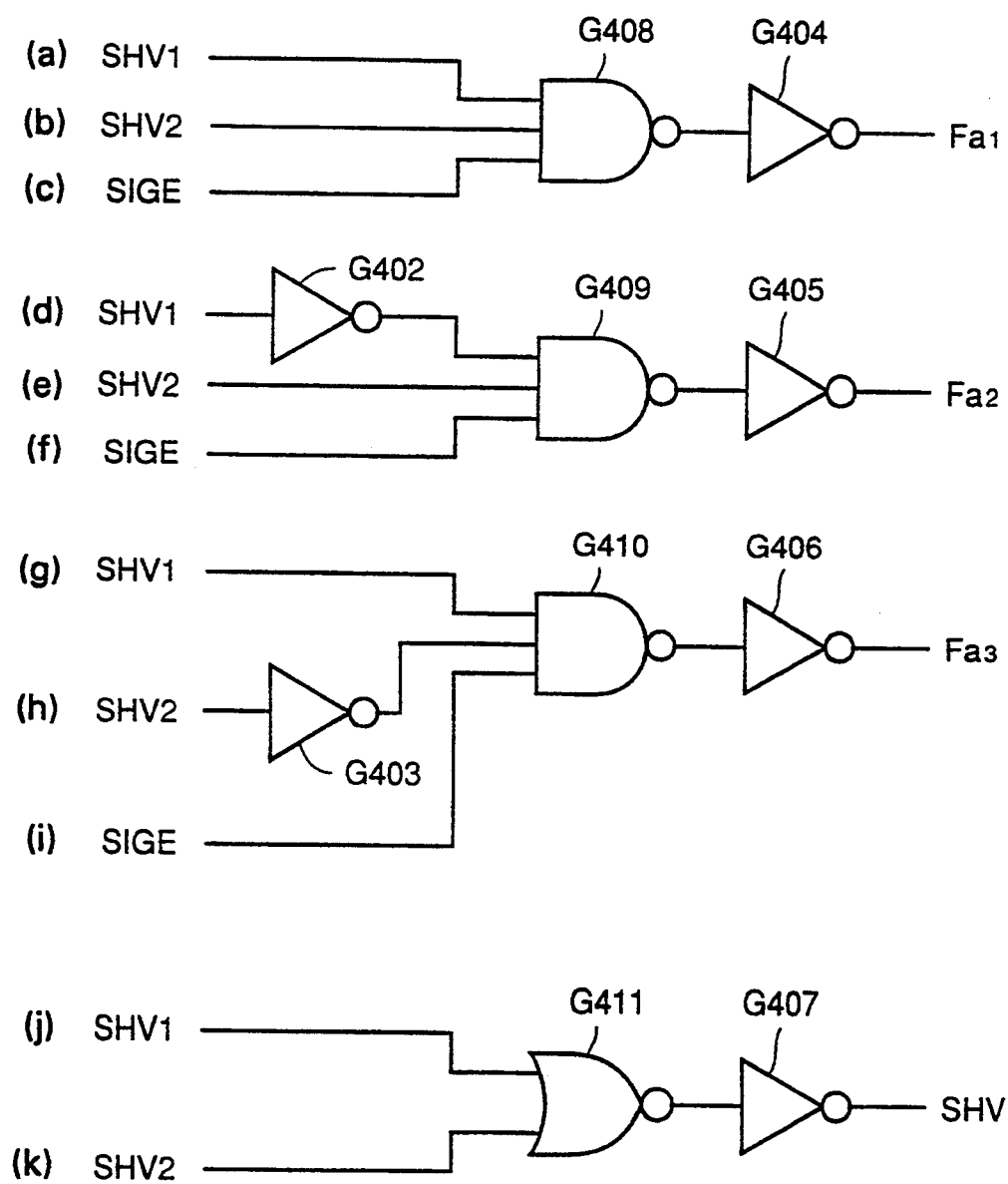
FIG. 26 is a schematic diagram showing a structure of a function setting circuit shown in FIG. 15.

The function setting circuit corresponding to the aforementioned two individual high voltage detecting signals SHV1 and SHV2 will be described with reference to the figures. FIG. 26 is a schematic diagram showing the structure of the function setting circuit 15 corresponding to the aforementioned two high voltage detecting signals SHV1 and SHV2. Referring to FIG. 26, function setting circuit 15 includes inverters G402 to G407, NAND gates G408 to G410 and an NOR gate G411.

Figure 27:
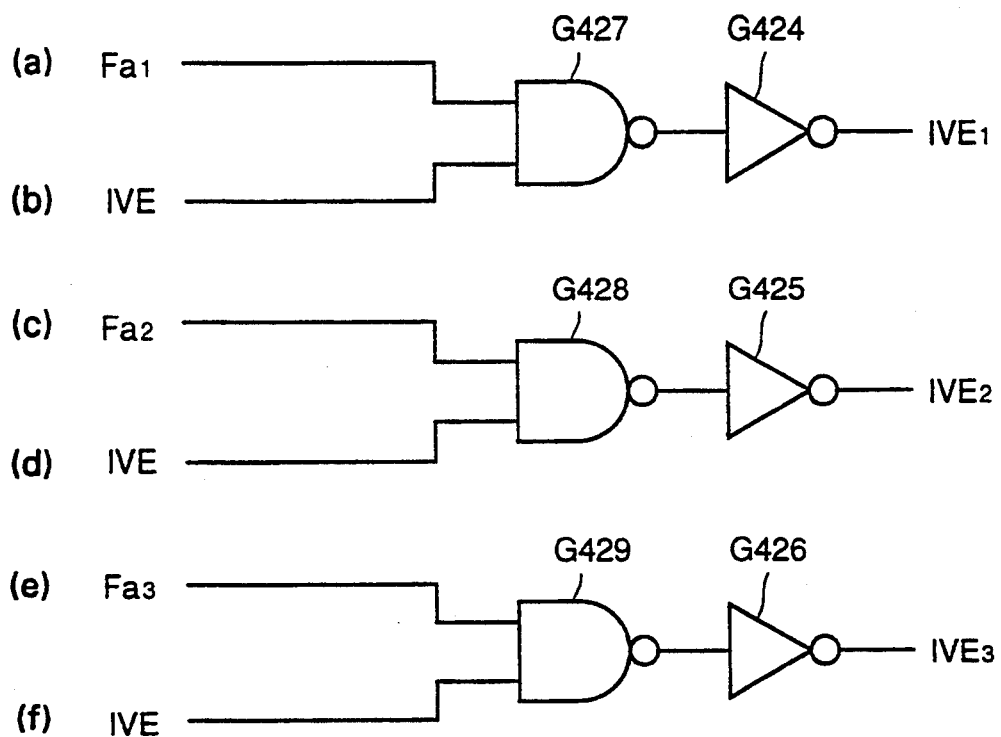
FIG. 27 is a schematic diagram showing a structure of an output buffer selecting circuit shown in FIG. 15.

FIG. 27 is a schematic diagram showing a structure of output buffer selecting circuit 16 corresponding to the aforementioned three function setting signals $F_{a1}$, $F_{a2}$ and $F_{a3}$. In FIG. 27, output buffer selecting circuit 16 includes inverters G424 to G426 and NAND gates G427 to G429.

The function setting timing using function setting circuit 15 and buffer selecting circuit 16 having the above described structure will be described. FIG. 16 is a timing chart showing the function setting timing.

For setting function, at first three external control signals /RAS, /CAS and /WE are input at the WCBR (WE, CAS Before RAS) timing, which is the signature mode setting timing, and at the same time, a high voltage of $V_{CC}+n \cdot V_{t1}$ or higher is input to external pins PA1 and PA2. At this time, at the rise of the row address strobe signal /RAS, the signature mode detecting signal SIGE rises to "H" and is latched. Then, while the signature mode detecting signal SIGE is at "H", if individual high voltage detecting signals SHV1 and SHV2 both at "H" are input to external pins PA1 and PA2 indicating that a high voltage higher than $V_{CC}+n \cdot V_{t1}$ is input, only the function setting signal $F_{a1}$ attains to "H"

and other function setting signals $F_{a2}$ and $F_{a3}$ are kept at "L" in function setting circuit 15.

When high voltage detecting signals SHV1 and SHV2 attain to "L", function setting signals $F_{a1}$, $F_{a2}$ and $F_{a3}$ attain to "L".

Therefore, once the signature mode is set, by successively changing the combination of the input of high voltage of $V_{CC}+n\cdot V_{t1}$ or higher to the external pins PA1 and PA2 for function setting, the function setting signals $F_{a1}$, $F_{a2}$ and $F_{a3}$ change. Then, when the external control signals /RAS, /CAS and /WE are input at the internal voltage monitoring timing shown in FIGS. 6 or 7, the monitored potential determined by the function setting signals $F_{a1}$, $F_{a2}$ and $F_{a3}$ is provided at the external pin PD (for example DQ pin).

Figure 17:
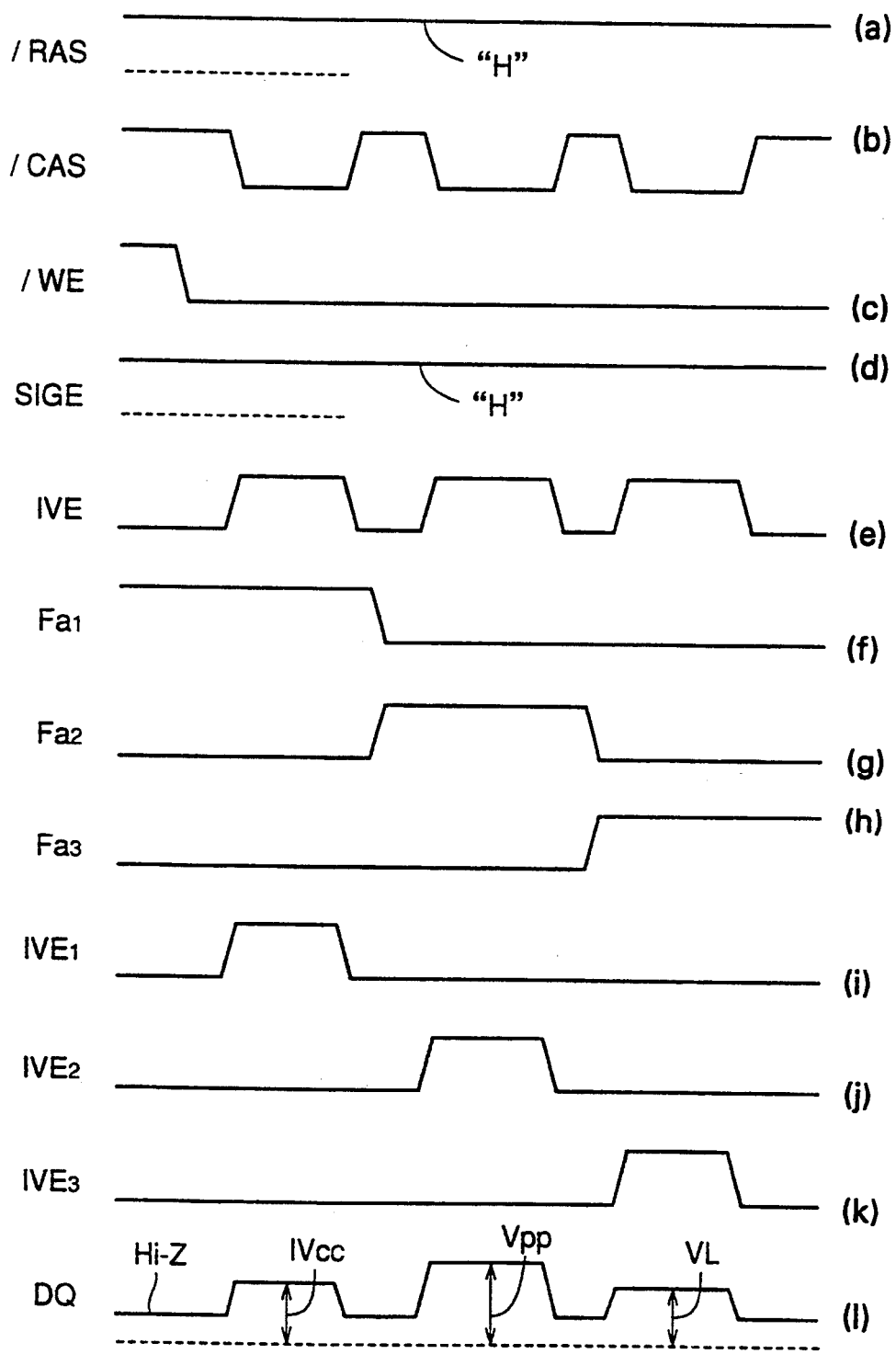
FIG. 17 is a timing chart showing an internal voltage monitoring timing of the status detecting circuit shown in FIG. 15.

The internal voltage monitoring timing will be described. FIG. 17 is a timing chart showing the internal voltage monitoring timing. The timing of output of the output buffer activating signal IVE shown in FIG. 12 is the same as the timing shown in FIG. 6. First, when the output buffer activating signal IVE attains to "H", the function setting signal $F_{a1}$ is at "H", so that the individual output buffer activating signal $IVE_1$ attains to "H", thus providing an output signal DQ of the internal supply voltage $IV_{CC}$ at the external pin PD. When the output buffer activating signal IVE attains to "H" the next time, the function setting signal $F_{a2}$ attains to "H". At this time, the individual output buffer activating signal $IVE_2$ attains to "H", so that the output signal DQ of the internal boosted supply voltage $V_{PP}$ is output to the external pin PD. When the output buffer activating signal IVE attains to "H" the next time, the function setting signal $F_{a3}$ attains to "H". At this time, the individual output buffer activating signal $IVE_3$ attains to "H", so that the output signal DQ of the reference voltage VL is output to the external pin PD.

Though two external pins for setting function have been used in the above described embodiment, the number of pins is not limited thereto. Although a plurality of output buffers are provided in the above description, only one integrated output buffer may be used.

In the above described embodiment, the combination of application of a high voltage to external pins for function setting is changed within the signature mode set timing and the internal voltage monitoring timing in order to monitor a plurality of internal voltages. However, it is also possible to monitor a prescribed internal voltage by changing the combination of high voltage application to the external pins for function setting only in the signature mode set timing. As for the status detecting circuit, the signature mode has been set by inputting three external control signals /RAS, /CAS and /WE and a high voltage to another external pin. However, the signature mode may be set only by the three external control signals /RAS, /CAS and /WE, and the monitor potential may be set by inputting a high voltage to an external pin for the function setting. It is also possible to set the function in accordance with the number of counts counted by the n bit counter within the signature mode set timing, using only the three external control signals /RAS, /CAS and /WE.

The method of monitoring in accordance with the various embodiments above can be applied to any semiconductor device containing an internal voltage lowering circuits of any characteristic. It is also applicable for monitoring the potential of internal supply line or a signal line in any semiconductor device not containing an internal voltage lowering circuit.

Figure 30:
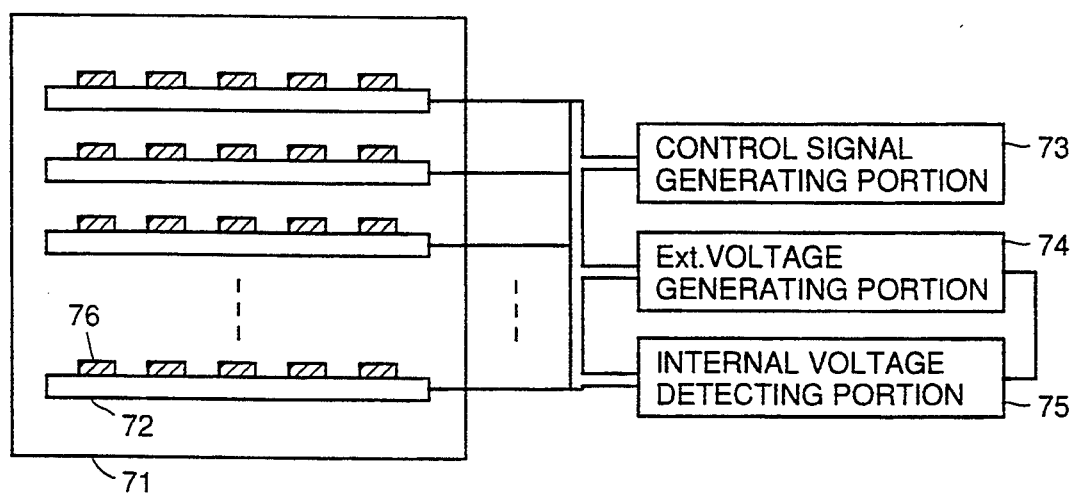
FIG. 30 is a block diagram showing a structure of a burn-in testing apparatus.

The burn-in test of the semiconductor device described above will be described. FIG. 30 is a block diagram showing a structure of a burn-in test apparatus for effecting a burn-in test.

Referring to FIG. 30, the burn-in test apparatus includes a thermostatic chamber 71, a control signal generating portion 73, an external voltage generating portion 74 and an internal voltage detecting portion 75. Thermostatic chamber 71 includes a burn-in board 72 and DRAMs 76. The DRAM 76 is a semiconductor device in accordance with the present invention, which allows monitoring of the internal voltage.

The inside of thermostatic chamber 71 is kept at a prescribed temperature and a prescribed moisture. Burn-in boards 72 are contained in thermostatic chamber 71 and on each of the burn-in boards 72, a plurality of DRAMs 76 are mounted.

Control signal generating portion 73 provides prescribed external control signals /RAS, /CAS, /WE, Ai and the like through the burn-in board 72, and the DRAM 76 carries out a prescribed operation in response to the external control signals. External supply voltage generating portion 74 applies a prescribed external supply voltage to the DRAM 76 to supply power to the DRAM 76. Internal voltage detecting portion 75 detects the internal supply voltage output from DRAM 76 in response to the external control signal output from control signal generating portion 73. Internal voltage detecting portion 75 provides the detected internal supply voltage to external voltage generating portion 74, and external voltage generating portion 74 adjusts the external supply voltage to be applied to the DRAM 76.

The burn-in test using the burn-in test apparatus having the above structure will be described. The burn-in test is one of the methods of screening, in which a large number of DRAMs 76 are put in the thermostatic chamber 71 to be subjected to a temperature and electric stress for a long period of time, so as to remove ones which may possibly be suffered from initial defects. In the burn-in test apparatus of the present invention, internal supply voltage of the DRAM 76 is monitored before effecting the burn-in test, and the external supply voltage is adjusted in the following manner so that the internal voltage has a prescribed value. In response to the external control signal output from control signal generating portion 73, the DRAM 76 provides an internal supply voltage to the internal voltage detecting portion 75. The internal voltage detecting portion 75 detects the input internal supply voltage, and if the detected internal supply voltage is different from the internal supply voltage at which the test is to be carried out, provides an instruction to the external voltage supplying portion 74 so as to adjust the external supply voltage such that the internal supply voltage has a prescribed value. In accordance with the instruction from the external voltage detecting portion 75, external voltage generating portion 74 adjusts the external supply voltage so that the internal supply voltage has a prescribed value, and provides the same to each DRAM 76. Consequently, it becomes possible to carry out burn-in test of the DRAMs 76 by a prescribed internal supply voltage. After the adjustment of the external supply voltage, the similar operation as in the common burn-in test is carried out in the burn-in test apparatus. Since the internal supply voltage can be directly output from the DRAM 76 in accordance with the present invention, it becomes possible to adjust the external supply voltage so that the internal supply voltage has a prescribed value while monitoring the same, when the aforementioned burn-in test is to be effected. Therefore, even when the internal supply voltage varies due to the fluctuation of the transistor parameters or the resistance value of resistance material, the internal supply voltage can be made constant, so that the internal supply voltage will never be an excessive voltage or a low accelerating voltage. Therefore, effective screening is possible. Therefore, characteristics test such as the burn-in test can be accurately effected on the semiconductor device in accordance with the present invention.

If the semiconductor devices are selected in accordance with the value of the internal supply voltage in advance, it becomes possible to effect burn-in test of a plurality of semiconductor devices at one time using the same external supply voltage. This further increases the efficiency of burn-in test. In addition, since the voltage of an internal supply line or a signal line can be output to an external pin for monitoring, defect analysis can be carried out easily even if the device is molded.

Figure 31:
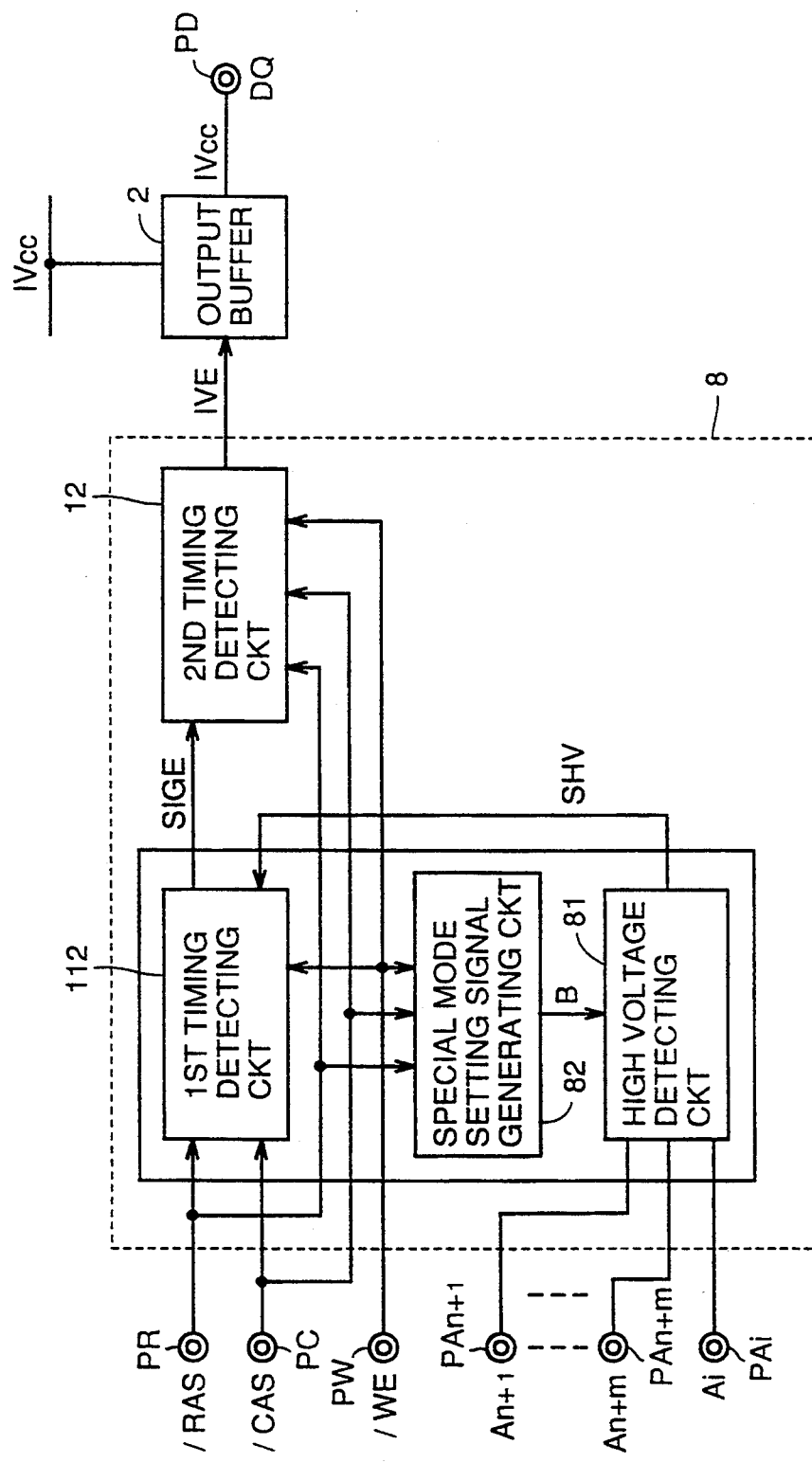
FIG. 31 is a block diagram showing a structure of a monitoring portion of the semiconductor device in accordance with the sixth embodiment of the present invention.

A semiconductor device in accordance with the sixth embodiment of the present invention will be described. In the semiconductor device in accordance with the sixth embodiment, a high voltage can be accurately detected even when the threshold voltage of the transistor constituting the high voltage detecting circuit fluctuates because of process variation and the like. FIG. 31 is a block diagram showing a structure of a monitoring portion of the semiconductor device in accordance with the sixth embodiment. This monitoring portions differs from the monitoring portion of the semiconductor device in accordance with the first embodiment shown in FIG. 1 in that a high voltage detecting circuit 81 and a special mode setting signal generating circuit 82 are added.

Figure 32:
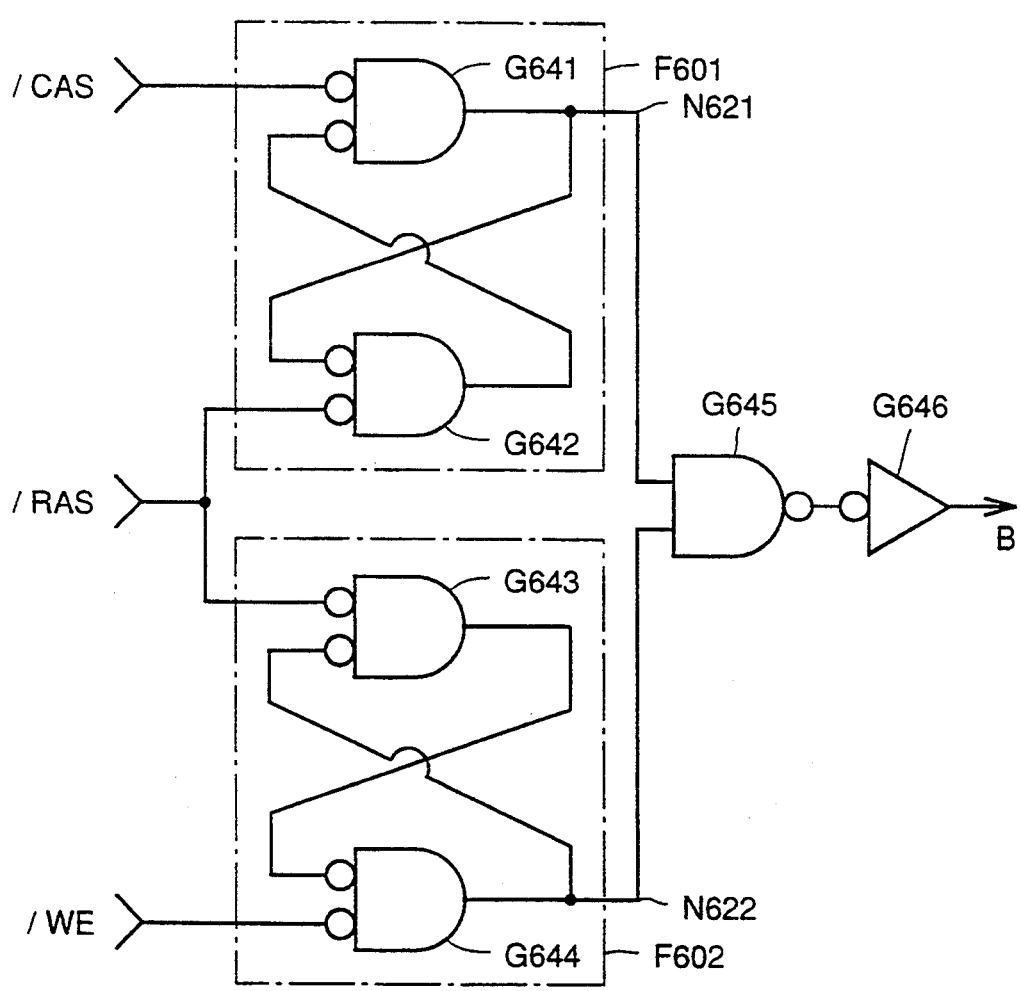
FIG. 32 is a schematic diagram showing a structure of a special mode setting signal generating circuit shown in FIG. 31.

The special mode setting signal generating circuit 82 will be described with reference to the figures. FIG. 32 is a schematic diagram showing a structure of special mode setting signal generating circuit 82.

Referring to FIG. 32, special mode setting signal generating circuit 82 includes flipflop circuits F601 and F602, an NAND gate G645 and an NOT gate G646. Flipflop circuit F601 includes NAND gates G641 and G642. Flipflop circuit F602 includes NAND gates G643 and G644. To the flipflop circuit F601, the column address strobe signal /CAS and the row address strobe signal /RAS are input. To flipflop circuit F602, the row address strobe signal /RAS and the write enable signal /WE are input. Output signals from flipflop circuits F601 and F602 are input to NAND gate G645. An output signal from NAND gate G645 is input to NOT gate G646. NOT gate G646 provides a special mode setting signal B.

Figure 33:
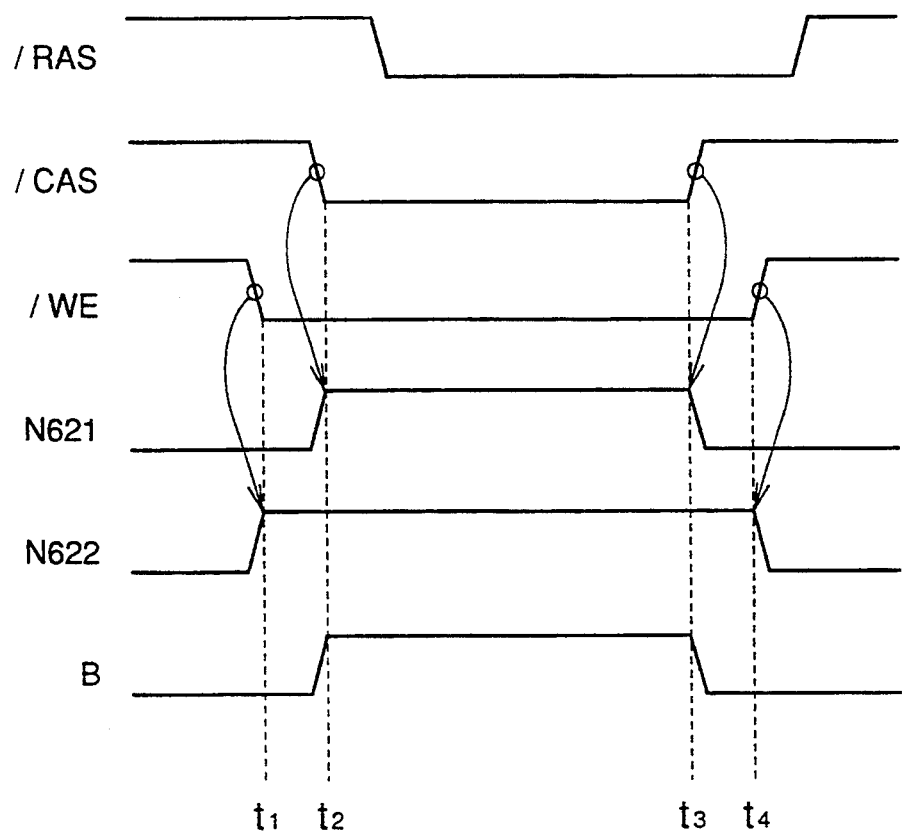
FIG. 33 is a timing chart showing the operation of the special mode setting signal generating circuit shown in FIG. 32.

The operation of the special mode setting signal generating circuit 82 will be described. FIG. 33 is a timing chart showing the operation of special mode setting signal generating circuit 82.

At the initial state, the column address strobe signal /CAS, the row address strobe signal /RAS and the write enable signal /WE are at the state of "H", while the potentials at nodes N621 and N622 are at "L". Therefore, the special mode setting signal B is at "L".

Then, at time $t_1$, when only the write enable /WE falls to the state of "L", flipflop circuit F602 latches the same, so that the potential at node N622 attains to "H". Since the potential at node N621 is kept at "L" at this time, the special mode setting signal B remains at "L".

Then, at time $t_2$, when the column address strobe signal /CAS falls to "L", flipflop circuit F601 latches the same and the potential at node N621 attains to "H". At this time, the output signal from NAND gate G645 attains to "L" and the special mode setting signal B rises to "H". Then, after the row address strobe signal /RAS falls to "L" and the column address strobe signal /CAS rises at time $t_3$, the potential at node N621 attains to "L". At this time, the special mode setting signal B falls to "L". Therefore, the special mode setting signal generating circuit 82 continuously outputs the special mode setting signal B at the state of "H" while the potentials at nodes N621 and N622 are both at "H" in response to the column address strobe signal /CAS, the row address strobe signal /RAS and the write enable signal /WE.

Figure 34:
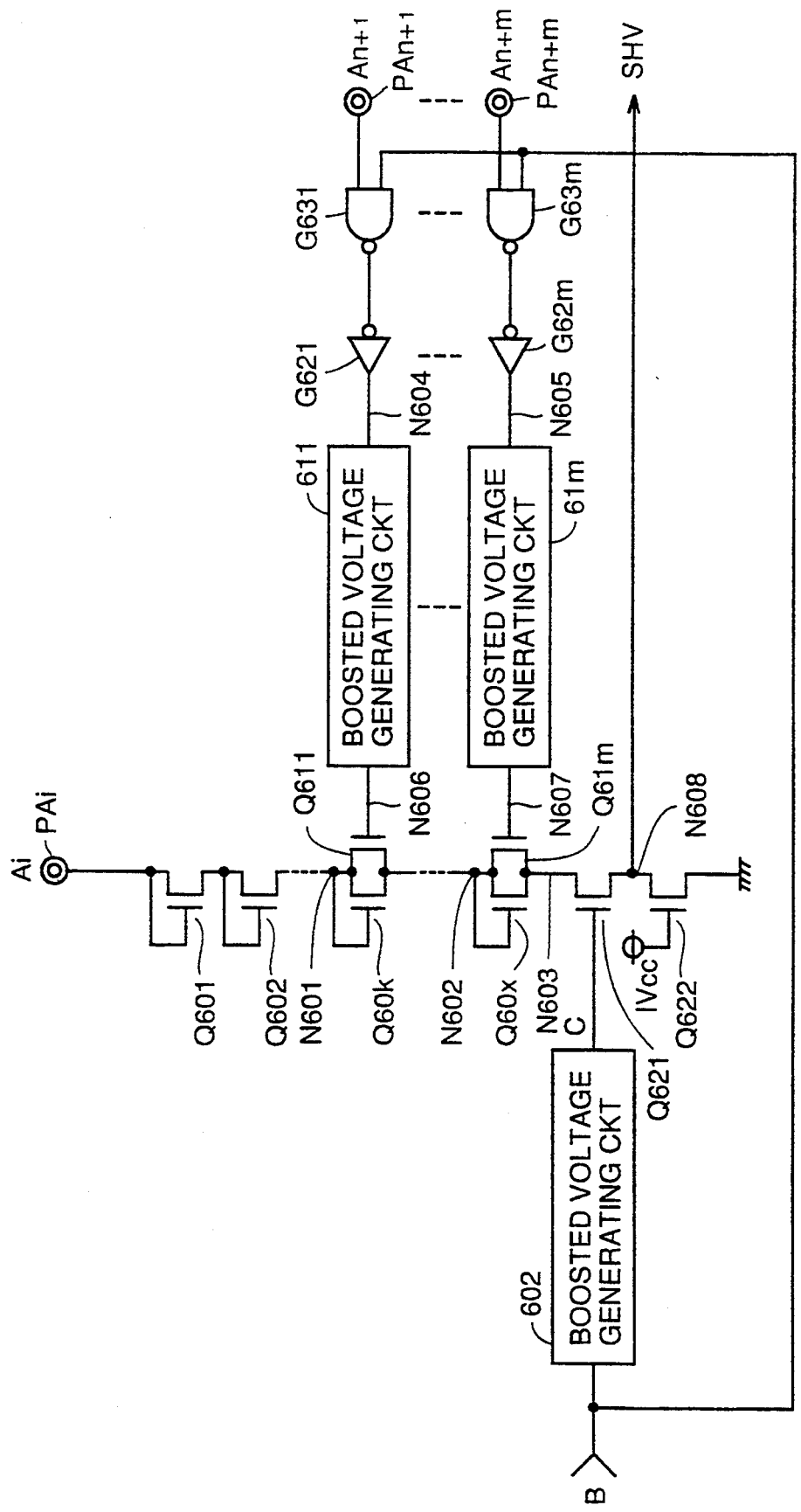
FIG. 34 shows a structure of a first example of the high voltage detecting circuit shown in FIG. 31.

The high voltage detecting circuit 81 will be described with reference to the figures. FIG. 34 shows a structure of high voltage detecting circuit 81.

Figure 35:
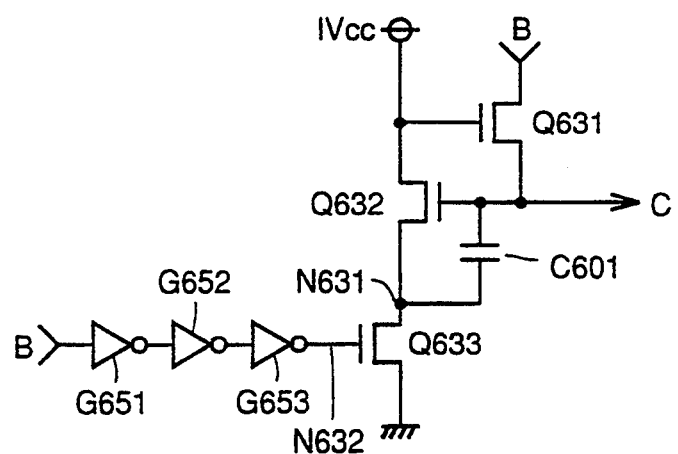
FIG. 35 is a schematic diagram showing a structure of a boosted voltage generating circuit shown in FIG. 34.

Referring to FIG. 34, high voltage detecting circuit 81 includes boosted voltage generating circuits 602 and 611 to 61m. The boosted voltage generating circuit will be described. FIG. 35 is a schematic diagram showing the structure of the boosted voltage generating circuit 602. Other boosted voltage generating circuits 611 to 61m have the same structure as boosted voltage generating circuit 602.

Referring to FIG. 35, boosted voltage generating circuit 602 includes n channel MOS transistors Q631 to Q633, NOT gates G651 to G653 and a capacitor C601. The special mode setting signal B is input to the drain of transistor Q631. Transistor Q631 has its gate connected to the internal supply voltage $IV_{CC}$, and the transistor Q631 is always at the on state. Transistor Q631 has its source connected to the gate of transistor Q632 and capacitor C601, and provides a boosted level signal C. Transistor Q632 has its drain connected to the internal supply voltage $IV_{CC}$ and its source connected to the drain of transistor Q633 and to capacitor C601. Transistor Q633 has its gate connected to NOT gate G653 and its source connected to the ground potential. NOT gates G651 to G654 are connected in series and the special mode setting signal B is input to NOT gate G651.

Figure 36:
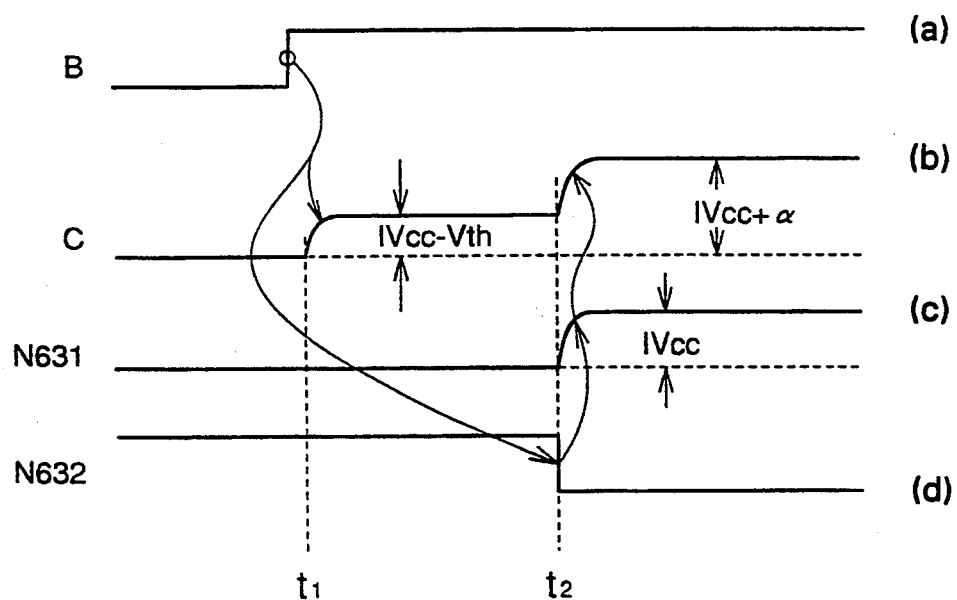
FIG. 36 is a timing chart showing the operation of the boosted voltage generating circuit shown in FIG. 35.

The operation of the boosted voltage generating circuit 602 having the above structure will be described. FIG. 36 is a timing chart showing the operation of the boosted voltage generating circuit 602.

When the special mode setting signal B is at "L", the potential at node N632 is at "H". Therefore, transistor Q633 turns on and the potential at node N631 and the boosted level signal C attain to "L". When the special mode setting signal B attains to "H", the boosted level signal C attains to the level of $IV_{CC}-V_{th}$. Here $V_{th}$ represents the threshold voltage of transistor Q631. At this time, since the potential of node N631 is kept at "L", the capacitor C631 is charged to the time $t_2$ with the voltage of $IV_{CC}-V_{th}$.

The special mode setting signal B is delayed by NOT gates G651 to G653, and at time t2, node N632 falls to "L". Therefore, transistor Q633 turns off and the potential at node N631 rises to the level of $IV_{CC}-2\cdot V_{th}$. As a result, theoretically, the boosted level signal C is boosted to the level of $2\cdot IV_{CC}-3\cdot V_{th}$ ($=IV_{CC}+\alpha$) because of the capacitive coupling of capacitor C601.

Again referring to FIG. 34, high voltage detecting circuit 81 will be described. High voltage detecting circuit 81 further includes n channel MOS transistors Q601 to Q60x, Q621, Q622, Q611 to Q61m, NOT gates G621 to G62m and NAND gates G631 to G63m.

The transistor Q601 has its gate and drain connected to an external pin PAi and its source connected to the gate and drain of transistor A602. Similarly, x transistors Q601 to Q60x are diode connected in series. m transistors Q611 to Q61m are connected in parallel with transistors Q60k to Q60x, respectively. Transistors Q611 to Q61m are connected to high voltage generating circuits 611 to 61m at their gates. Transistor Q621 has its drain connected to sources of transistors Q60x and Q61m, its source connected to the drain of transistor Q622 and its gate connected to high voltage generating circuit 602. Transistor Q622 has its source connected to the ground potential and its gate connected to the internal supply voltage $IV_{CC}$. m NAND gates G631 to G63m are connected to m external pins $PA_{n+1}$ to $PA_{n+m}$ at one input terminal of each, and at the other input terminal, a special mode setting signal B provided from special mode setting signal generating circuit 82 is input. In case of a DRAM, address pins, to which address signals not used for the address key are input, are used as external pins $PA_{n+1}$ to $PA_{n+m}$. The address key means that a specific key is used for setting a certain one of a plurality of test modes. Therefore, a prescribed signal can be input to the external pins $PA_{n+1}$ to $PA_{n+m}$ without any influence to the setting of the test mode.

Output terminals of NAND gates G631 to G63m are connected to input terminals of NOT gates G621 to G62m, respectively. Output terminals of NOT gates G621 to G62m are connected to boosting voltage generating circuits 611 to 61m.

Different from transistor Q4 in high voltage detecting circuit 111 shown in FIG. 2, a transistor Q622 having low on resistance is used in high voltage detecting circuit 81. This is to improve rising characteristic of the high voltage detecting signal SHV.

The operation of high voltage detecting circuit 81 structured as described above is as follows. Since the internal supply voltage $IV_{CC}$ is input to the gate of transistor Q622, transistor Q622 is always at the on state. When the row address strobe signal /RAS, the column address strobe signal /CAS and the write enable signal /WE are at "L", the special mode setting signal B and the boosted level signal C are at the state of "L", and therefore transistor Q621 is off. Accordingly, the potential at node N608 is at "L" and the high voltage detecting signal SHV output from high voltage detecting circuit 81 will be "L".

When the row address strobe signal /RAS, the column address strobe signal /CAS and the write enable signal /WE are input at the WCBR timing and a voltage V higher than the "H" level of the normal input signal is input to the external pin PAi, the following operation occurs. First, the special mode setting signal B attains to "H", and the boosted level signal C attains to the level of the boosted voltage $(IV_{CC}+\alpha)$. The boosted voltage $(IV_{CC}+\alpha)$ is higher than the potential at node N603 by at least the threshold value $V_{th}$. Meanwhile, the voltage of the signal which has the high voltage V input to the external pin PAi is lowered by the threshold voltage $V_{th}$ which corresponds to the number of transistors Q601 to Q60x. Therefore, the potential at node N603 would be $V - x \cdot V_{th}$. However, since transistor Q622 is on, the potential at node N603 comes to be $V - x \cdot V_{th} - (IV_{CC} - V_{th})$. Since a signal having the level of the boosted voltage $(IV_{CC}+\alpha)$ has been input to the gate of transistor Q621, it is always at the on state, so that the potentials at nodes Q603 and Q608 come to be equal to each other, whereby a high voltage detecting signal SHV at the level of $V - x \cdot V_{th} - (IV_{CC} - V_{th})$ is output.

The voltages in high voltage detecting circuit 81 will be described more specifically. When it is assumed that $V=8.0$ (V), $IV_{CC}=3.3$ (V), $V_{th}=0.7$ (V), and $x=6$, the voltage of high voltage detecting signal SHV would be 1.2 (V). This voltage is sufficient to invert the output from NAND gate G104 shown in FIG. 22, and therefore detection of a high voltage can be signaled to the first timing detecting signal 112.

When a voltage of $V=6.5$ (V) is input as the maximum value of the input voltage to the device, it holds that $V - x \cdot V_{th} < V_{CC} - V_{th}$, so that the high voltage detecting signal SHV is provided at the level of "L". Therefore, the high voltage detecting signal SHV can be made "H" only when a high voltage V which is higher than the level of "H" of the normal input signal is input to the external pin PAi.

The operation when the threshold voltage $V_{th}$ of transistors Q601 to Q60x is increased because of the variation of the process will be described. When $V_{th}$ becomes $V_{th}=0.8$ (V), for example, the voltage of the high voltage detecting signal SHV would be 0.7 (V), so that the output of NAND gate G104 shown in FIG. 22 cannot be inverted. Therefore, detection of high voltage cannot be signaled to the timing detecting circuit 112.

Figure 37:
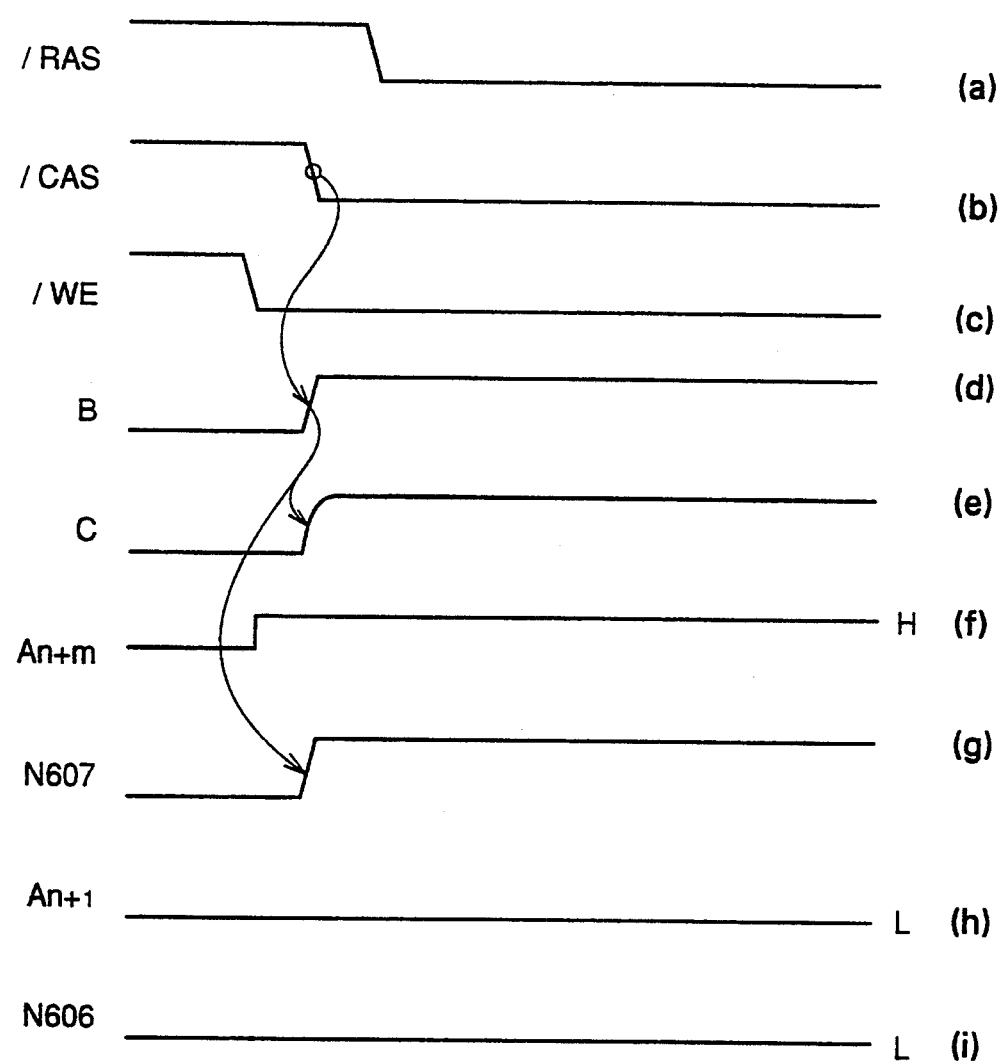
FIG. 37 is a timing chart showing the operation of the high voltage detecting circuit shown in FIG. 34.

FIG. 37 is a timing chart showing the operation of high voltage detecting circuit 81 in the above described case. When the row address strobe signal /RAS, the column address strobe signal /CAS and the write enable signal /WE are input at the WCBR timing, the special mode setting signal B rises. When the address signal $A_{n+m}$ input to external pin $PA_{n+m}$ is raised, the potential at node N605 attains to "H", and the boosted voltage generating circuit 61m provides a signal at the level of the boosted voltage $(IV_{CC}+\alpha)$ to the gate of transistor Q61m. Consequently, transistor Q61m turns on, and the potential at node N608 attains to $V - (x-1) \cdot V_{th}$, thus increased by the potential of the threshold value Vth. In the above described specific example, the voltage of high voltage detecting signal SHV will be 1.5 (V), which is enough to invert the output signal of NAND gate G104 shown in FIG. 22, and therefore detection of high voltage can be signaled to the first timing detecting circuit 112.

If the output from NAND gate G104 is not inverted even by the above described operation, it is possible to increase the potential at node N608 by the potential of the threshold value $V_{th}$ by inputting an address signal of "H" to the next external pin $PA_{n+m-1}$ (not shown) so as to turn on the transistor Q61m−1. By repeating this operation, it becomes possible to invert the output signal of NAND gate G104 without fail by inputting the high potential V, which is a constant potential, from the external pin PAi. Therefore, even if the level of recognizing the high voltage V changes because of the fluctuation of threshold voltage $V_{th}$ derived from variation in the process, for example, a constant high voltage V can be detected, so that erroneous operation can be prevented and reliability of the device can be improved.

Figure 38:
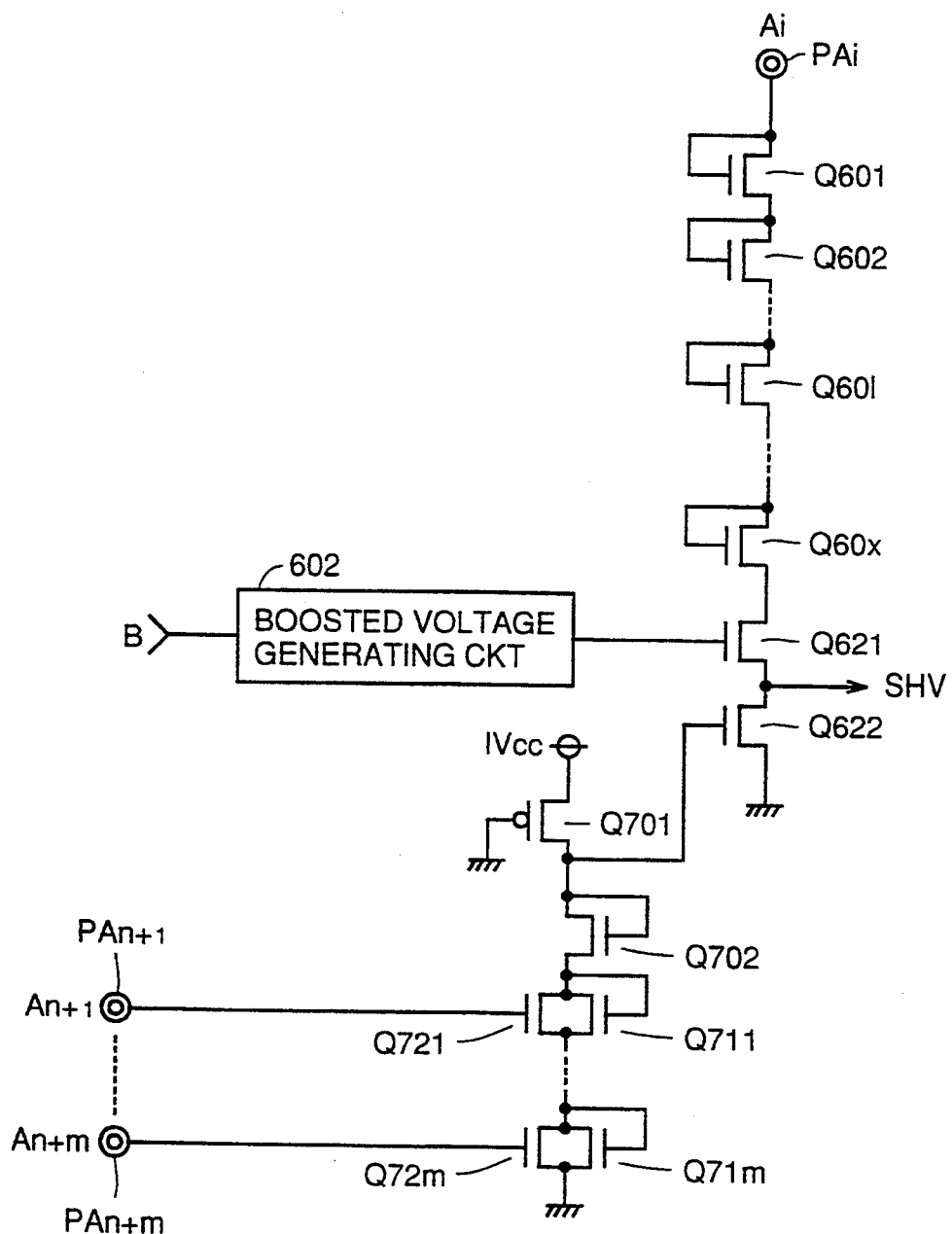
FIG. 38 shows a structure of a second example of the high voltage detecting circuit shown in FIG. 31.

A second example of the high voltage detecting circuit 81 will be described with reference to the figures. FIG. 38 shows a structure of the high voltage detecting circuit in accordance with the second example. In FIG.

38, the same portions as the high voltage detecting circuit shown in FIG. 34 are denoted by the same reference characters and description thereof is not repeated.

Referring to FIG. 38, the high voltage detecting circuit includes a boosted voltage generating circuit 602, n channel MOS transistors Q601 to Q60x, Q621, Q622, Q702, Q711 to Q71m, Q721 to Q72m and a p channel MOS transistor Q701.

Transistor Q701 has relatively high on resistance. Transistor Q701 has its drain connected to the internal supply voltage $IV_{CC}$ and its gate connected to the ground potential. Transistor Q701 has its source connected to the gate of transistor Q622, and to the gate and drain of transistor Q711. Transistor Q711 has its gate and drain connected to the source of transistor Q702. Similarly, transistors up to Q71m are connected in series and transistor Q71m has its source connected to the ground potential. Therefore, y (=m+1) transistors Q702, Q711 to Q71m are diode connected in series. m transistors Q721 to Q72m are connected in parallel with transistors Q711 to Q71m, respectively, and the gates of transistors Q721 to Q71m are connected to external pins $PA_{n+1}$ to $PA_{n+m}$.

The operation of the high voltage detecting circuit having the above described structure is as follows. The potential at the gate of transistor Q622 is at $y \cdot V_{th}$, and the high voltage detecting signal SHV rises when $V - x \cdot V_{th} > y \cdot V_{th} - V_{th}$.

Assume that the threshold voltage $V_{th}$ is shifted rather high because of process variation or the like and it holds $V - x \cdot V_{th} < y \cdot V_{th} - V_{th}$. When an address signal $A_{n+1}$ of "H" is input to the external pin $PA_{n+1}$, transistor Q721 turns on and the voltage drop by the threshold value $V_{th}$ of the diode connected transistor Q711 can be neglected. Therefore, the potential at the gate of transistor Q622 comes to be $(y-1) \cdot V_{th}$, lowered by the threshold voltage $V_{th}$. As a result, the condition of $V_x \cdot V_{th} > (y-2) \cdot V_{th}$ can be satisfied. Thus the high voltage detecting signal SHV can be raised to "H", the output signal from NAND gate G104 shown in FIG. 22 can be inverted, and thus the detection of high voltage can be signaled to the first timing detecting signal 112.

If the threshold voltage $V_{th}$ is changed still higher, the transistors Q722 to Q72m are turned on by successively inputting address signals $A_{n+2}$ to $A_{n+m}$ which are at "H" to external pins $PA_{n+2}$ to $PA_{n+m}$. Consequently, the gate voltage of transistor Q622 is lowered, the high voltage detecting signal SHV is raised to "H", the output signal from NAND gate G104 is inverted, and the detection of the high voltage can be signaled to the first timing detecting circuit 112.

By the above described operation, even if the threshold value $V_{th}$ fluctuates rather higher, detection of a high voltage can be easily signaled to the first timing detecting circuit 112 with the high voltage V input to the external pin PAi kept constant.

The high voltage detecting circuit described above can be applied not only to the status detecting circuit 1 but also to any semiconductor device going through a prescribed test in response to a prescribed high voltage signal which is externally input.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device on a chip providing a potential at a prescribed internal node to an external terminal of said chip in a prescribed mode, comprising:
   a first designating signal output means responsive to a first external control signal from off said chip outputting a first designating signal designating said prescribed mode;
   a second designating signal output means responsive to a second external control signal from off said chip and to said first designating signal for outputting a second designating signal to activate a connection to said external terminal; and
   output means responsive to said second designating signal for connecting the potential of said prescribed internal node to said external terminal of said chip.

2. The semiconductor device according to claim 1, wherein
   said first external control signal includes a high potential signal having a potential higher than a normally input high potential; and
   said first designating signal output means includes high voltage detecting means responsive to said high potential signal for outputting a high potential detecting signal, and
   timing detecting means responsive to said first external control signal except said high potential signal and to said high potential detecting signal for outputting said first designating signal.

3. The semiconductor device according to claim 2, wherein
   said semiconductor device is a dynamic random access memory;
   said first external control signal includes a row address strobe signal, a column address strobe signal, a write enable signal and an address signal; and
   said high potential signal is the address signal.

4. The semiconductor device according to claim 3, wherein
   when said write enable signal and said column address strobe signal which are at an active state are input, said row address strobe signal which is at the active state is input thereafter and said high voltage detecting signal which is at the active state is input, said first timing detecting circuit sets said first designating signal in response to a timing of change of said row address strobe signal from the active state to an inactive state.

5. The semiconductor device according to claim 3, wherein
   said write enable signal and said column address strobe signal are at an inactive state,
   said first timing detecting circuit resets said first designating signal in response to a timing of change of said row address strobe signal from an active state to the inactive state.

6. The semiconductor device according to claim 3, when said write enable signal is at an inactive state and said column address strobe signal which is at an active state is input,
   said first timing detecting circuit resets said first designating signal in response to a timing of change of the row address strobe signal from the active state to the inactive state.

7. The semiconductor device according to claim 1, wherein said second external control signal is different from a signal which changes state of said first designating signal.

8. The semiconductor device according to claim 7, wherein
said semiconductor device is a dynamic random access memory, and
said second external control signal includes a row address strobe signal, a column address strobe signal and a write enable signal.

9. The semiconductor device according to claim 1, wherein
said first designating signal output means includes
counting operation control means responsive to said first external control signal for outputting a counting operation control signal for controlling counting operation, and
counting means responsive to said counting operation control signal for counting change of status of said first external control signal and for outputting said first designating signal when the counted values reaches a prescribed value.

10. The semiconductor device according to claim 9, wherein
said semiconductor device is a dynamic random access memory, and
said first external control signal includes a row address strobe signal, a column address strobe signal, and a write enable signal.

11. The semiconductor device according to claim 10, wherein
said counting operation control means provides, after said write enable signal and said column address strobe signal which are at an active state are input, a counting operation starting signal for designating start of counting operation to said counting means in response to a timing of change of said row address strobe signal from an inactive state to the active state, and
said counting means counts the change of status of said column address strobe signal in response to said counting operation starting signal.

12. The semiconductor device according to claim 10, wherein
said counting operation control means provides, when said column address strobe signal is at the active state and said write enable signal is at the inactive state, a reset signal for designating resetting of said first designating signal to said counting means in response to a timing of change of said row address strobe signal from the inactive state to the active state, and
said counting means resets said first designating signal in response to said reset signal.

13. The semiconductor device according to claim 1, wherein
said second designating signal output means further includes
selecting means for selecting said prescribed internal node based on a third external control signal for selecting said prescribed internal node, and output a third designating signal designating output of the potential of the internal node selected by said selecting means; and
said output means outputs the potential of said selected prescribed internal node to said external terminal in response to said second and third designating signals.

14. The semiconductor device according to claim 1, wherein
said first external control signal includes a plurality of high potential signals having higher potential than a normally input high potential,
said high potential signals being selecting signals for selecting said prescribed internal node;
said first designating signal output means includes
a plurality of high potential detecting means responsive to said plurality of high potential signals for outputting a plurality of first high potential detecting signals,
second high potential detecting means responsive to said plurality of first high potential detecting signals for outputting a second high potential detecting signal, and
first timing detecting means responsive to said first external control signal except said high potential signal and to said second high potential detecting signal for outputting said first designating signal;
said second designating Signal output means includes
second timing detecting means responsive to said first designating signal and to said second external control signal for outputting a potential output designating signal designating output of the potential of the internal node,
internal node selecting means responsive to said first high potential detecting signal for outputting an internal node selecting signal selecting said prescribed internal node, and
selecting means responsive to said potential output designating signal and said internal node selecting signal for outputting a plurality of second designating signals for designating output of the potential of the internal node selected by said internal node selecting means; and
said output means includes
a plurality of potential output means responsive to said plurality of second designating signal for outputting potential of the designated internal node.

15. The semiconductor device according to claim 14, wherein
said semiconductor device is a dynamic random access memory;
said first external control signal includes a row address strobe signal, a column address strobe signal, a write enable signal and an address signal;
said high potential signal includes an address signal; and
said second external control signal includes a row address strobe signal, a column address strobe signal and a write enable signal.

16. The semiconductor device according to claim 1, wherein
said first external control signal includes a high potential signal which has a potential higher than a normally input high potential;
said first designating signal output means includes
detecting operation control means responsive to said first external control signal except said high potential signal for outputting a detecting operation control signal for controlling high potential detecting operation,
high potential detecting means responsive to said detecting operation control signal and said high potential signal for outputting a high potential detecting signal, and a timing detecting circuit responsive to said first external control signal except said high potential signal and to said high potential detecting signal for outputting said first designating signal;

said high potential detecting means includes voltage lowering means for converting said high potential signal to a signal of a second potential by lowering the voltage by a first voltage, detecting means for outputting, when the potential of said signal of the second potential is higher than a third potential, said high potential detecting signal, and adjusting means for adjusting said first voltage or third potential.

17. A semiconductor device on a chip, comprising:

voltage lowering means for converting an external input signal having a first potential to a signal having a third potential by lowering the potential by a second potential;

detecting means for outputting, when the potential of said signal of the third potential is higher than a fourth potential, a prescribed first potential detecting signal; and adjusting means for adjusting one of said second potential or said fourth potential in response to an external control signal from off said chip.

18. The semiconductor device according to claim 17, wherein said voltage lowering means receives said external input signal of the first potential and includes a first n type transistor group including a plurality of diode connected n type transistors connected in series;

said detecting means includes first boosted voltage generating means responsive to a control signal for outputting a first boosted signal of a boosted potential, a first n type transistor connected to said first n type transistor group and receiving at its gate said first boosted signal, and a second n type transistor connected between said first n type transistor and a ground potential and receiving at its gate a supply voltage IV$_{CC}$;

said adjusting means for adjusting said second voltage includes second boosted voltage generating means responsive to an adjusting signal for adjusting said second voltage for outputting a second boosted signal of a boosted potential, and a second n type transistor group connected parallel to a part of said first n type transistor group and receiving at its gate said second boosted signal.

19. The semiconductor device according to claim 17, wherein said voltage lowering means receives said external input signal of the first potential and includes a first n type transistor group including a plurality of diode connected n type transistors connected in series;

said detecting means includes first boosted voltage generating means responsive to a control signal for outputting a first boosted signal of a boosted potential, a first n type transistor connected to said first n type transistor group and receiving at its gate said first boosted signal, a p type transistor connected to a supply voltage and receiving at its gate the ground potential, a second n type transistor group connected to said p type transistor and including a plurality of diode connected n type transistors connected in series, and a second n type transistor connected between said first n type transistor and the ground potential and receiving at its gate an output from a contact node between said p type transistor and said second n type transistor group; and said adjusting means for adjusting the fourth potential includes a third n type transistor connected parallel to a part of said second n type transistor group and receiving at its gate an adjusting signal for adjusting said fourth potential.

20. The semiconductor device according to claim 1, wherein the potential of said prescribed internal node is generated by:

lowered voltage generating means for lowering an externally supplied voltage.

* * * * *